US010585506B2

(12) United States Patent
Shima et al.

(10) Patent No.: US 10,585,506 B2
(45) Date of Patent: Mar. 10, 2020

(54) DISPLAY DEVICE WITH HIGH VISIBILITY REGARDLESS OF ILLUMINANCE OF EXTERNAL LIGHT

(71) Applicant: SEMICONDUCTOR ENERGY LABORATORY CO., LTD., Atsugi-shi, Kanagawa-ken (JP)

(72) Inventors: Yukinori Shima, Gunma (JP); Kengo Akimoto, Kanagawa (JP); Yuki Okamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 90 days.

(21) Appl. No.: 15/218,135

(22) Filed: Jul. 25, 2016

(65) Prior Publication Data
US 2017/0032728 A1 Feb. 2, 2017

(30) Foreign Application Priority Data

Jul. 30, 2015 (JP) .................. 2015-150945
Jun. 16, 2016 (JP) .................. 2016-119606

(51) Int. Cl.
G06F 3/041 (2006.01)
H01L 27/32 (2006.01)
(Continued)

(52) U.S. Cl.
CPC ............ G06F 3/0412 (2013.01); G06F 3/042 (2013.01); G09G 3/3233 (2013.01);
(Continued)

(58) Field of Classification Search
CPC .... G02F 1/13318; G06F 3/0412; G06F 3/042; G09G 2300/0819; G09G 2300/0842;
(Continued)

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

(Continued)

Primary Examiner — Ram A Mistry
(74) Attorney, Agent, or Firm — Nixon Peabody LLP; Jeffrey L. Costellia

(57) ABSTRACT

A display device having high visibility regardless of illuminance of external light is provided. A display device with reduced power consumption is provided. The display device includes a first light-receiving circuit including a first light-receiving element; and a pixel circuit including a display element. The first light-receiving circuit and the pixel circuit are formed over the same substrate. The gray level of the display element is changed according to a change in the amount of light to which the first light-receiving element is exposed. In particular, the gray level of the display element is decreased with a decrease in the amount of light exposure.

13 Claims, 20 Drawing Sheets

(51) Int. Cl.
  *H01L 29/786* (2006.01)
  *G06F 3/042* (2006.01)
  *G09G 3/3233* (2016.01)
  *H01L 27/12* (2006.01)
  *G02F 1/133* (2006.01)

(52) U.S. Cl.
  CPC ...... *H01L 27/1225* (2013.01); *H01L 27/3244* (2013.01); *H01L 29/7869* (2013.01); *G02F 1/13318* (2013.01); *G09G 2300/0819* (2013.01); *G09G 2300/0842* (2013.01); *G09G 2310/0262* (2013.01); *G09G 2320/045* (2013.01); *G09G 2320/0626* (2013.01); *G09G 2360/144* (2013.01); *G09G 2380/02* (2013.01)

(58) Field of Classification Search
  CPC ..... G09G 2310/0262; G09G 2320/045; G09G 2320/0626; G09G 2360/144; G09G 2380/02; G09G 3/3233; H01L 27/3244; H01L 29/7969
  See application file for complete search history.

(56) References Cited

U.S. PATENT DOCUMENTS

| | | | |
|---|---|---|---|
| 6,265,833 B1 | 7/2001 | Kim et al. | |
| 6,294,274 B1 | 9/2001 | Kawazoe et al. | |
| 6,337,675 B1 | 1/2002 | Toffolo et al. | |
| 6,424,326 B2 | 7/2002 | Yamazaki et al. | |
| 6,563,174 B2 | 5/2003 | Kawasaki et al. | |
| 6,614,076 B2 | 9/2003 | Kawasaki et al. | |
| 6,727,522 B1 | 4/2004 | Kawasaki et al. | |
| 6,828,951 B2 | 12/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,173,279 B2 | 2/2007 | Yamazaki et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,397,064 B2 | 7/2008 | Yamazaki et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,629,610 B2 | 12/2009 | Yamazaki et al. | |
| 7,674,650 B2 | 3/2010 | Akimoto et al. | |
| 7,688,290 B2 | 3/2010 | Yamazaki et al. | |
| 7,732,819 B2 | 6/2010 | Akimoto et al. | |
| 7,911,464 B2 * | 3/2011 | Childs | G09G 3/3233 345/102 |
| 8,253,662 B2 | 8/2012 | Yamazaki et al. | |
| 8,441,209 B2 | 5/2013 | Yamazaki et al. | |
| 8,743,028 B2 | 6/2014 | Yamazaki et al. | |
| 9,035,908 B2 | 5/2015 | Kurokawa | |
| 9,087,476 B2 | 7/2015 | Yamazaki et al. | |
| 9,088,006 B2 | 7/2015 | Yamazaki et al. | |
| 9,368,089 B2 | 6/2016 | Yamazaki et al. | |
| 9,426,848 B2 | 8/2016 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0007353 A1 * | 1/2005 | Smith | G09G 3/3233 345/204 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119548 A1 * | 6/2006 | Lan | G09G 3/3233 345/76 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0204384 A1 * | 8/2008 | Lee | G09G 3/3233 345/83 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0135185 A1 | 5/2013 | Nagatsuka et al. | |
| 2013/0299789 A1 | 11/2013 | Yamazaki et al. | |
| 2015/0325812 A1 | 11/2015 | Yamazaki et al. | |
| 2016/0190331 A1 | 6/2016 | Miyake et al. | |

FOREIGN PATENT DOCUMENTS

| | | |
|---|---|---|
| JP | 60-198861 A | 10/1985 |
| JP | 63-210022 A | 8/1988 |

(56) References Cited

FOREIGN PATENT DOCUMENTS

| | | |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-197522 A | 10/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007. vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et at., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka,M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et at., "21.3:4.0 in. QVGA AMOLED Display Using In-Ga-Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m <4):a $Zn_4s$ conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et at., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AMOLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 9A1
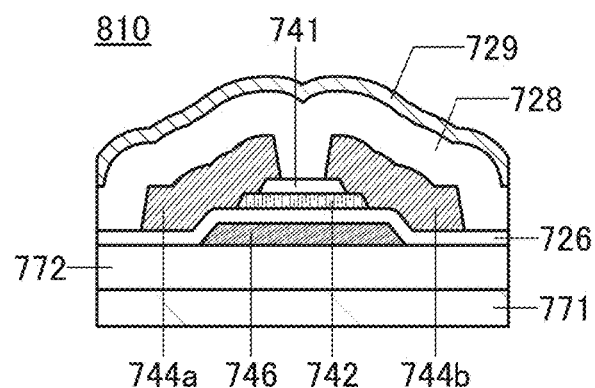
FIG. 9A2
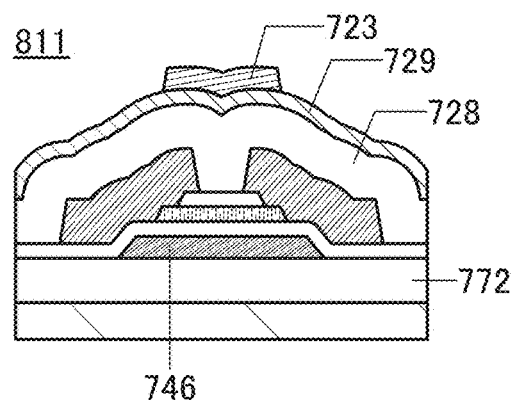
FIG. 9B1
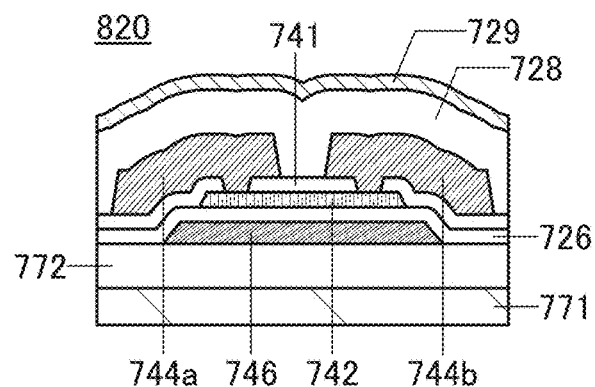
FIG. 9B2
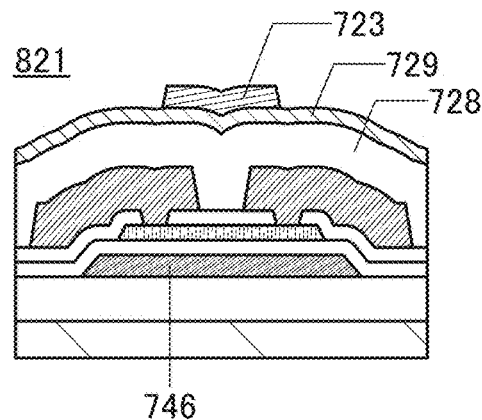
FIG. 9C1
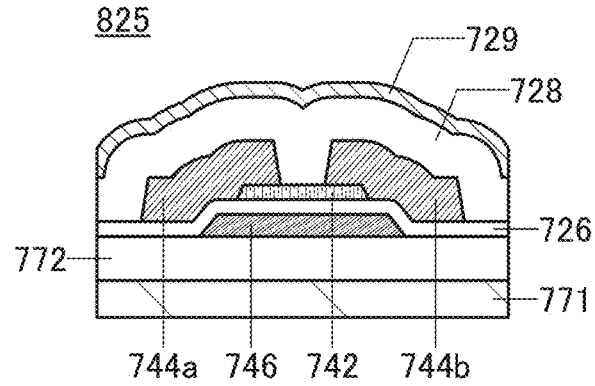
FIG. 9C2
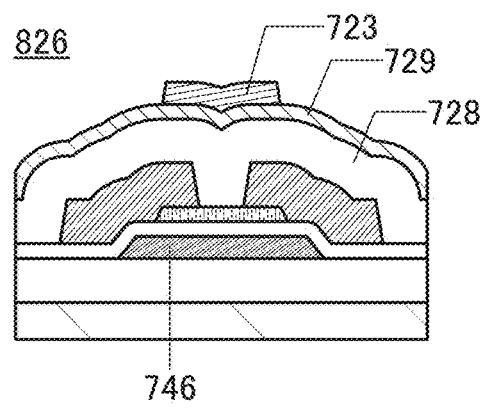

FIG. 10A1
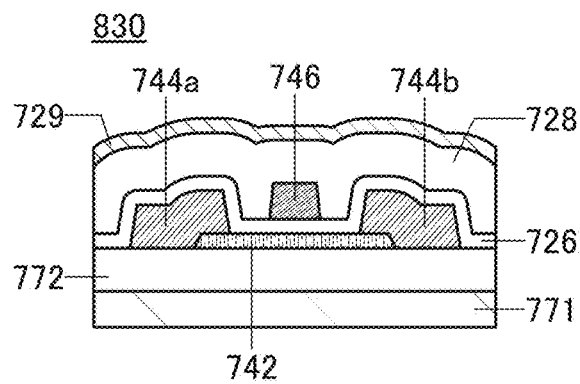
FIG. 10A2
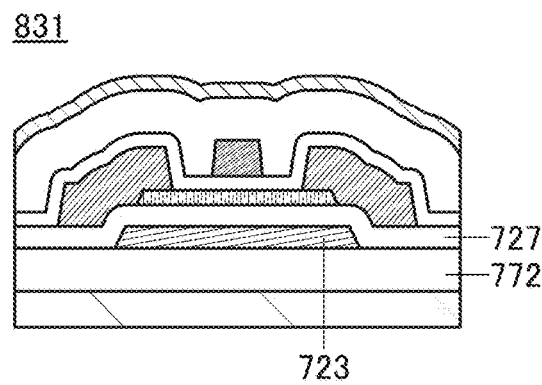
FIG. 10A3
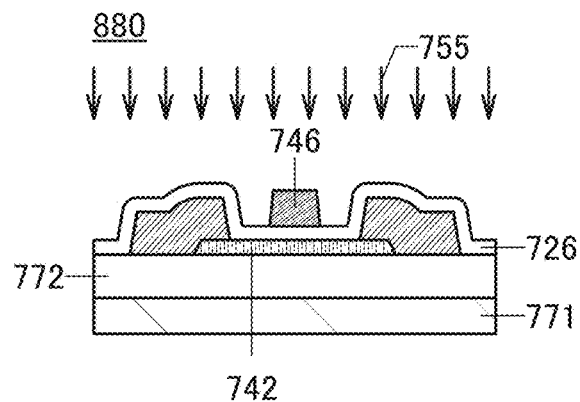
FIG. 10B1
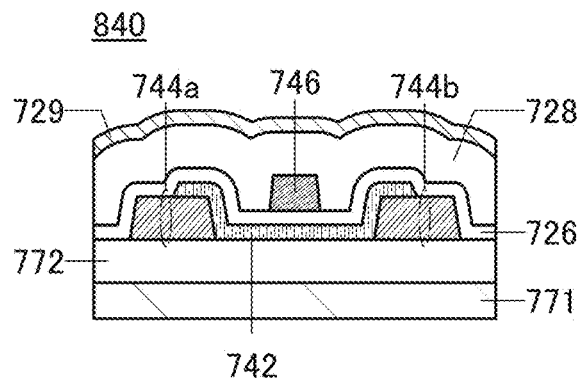
FIG. 10B2
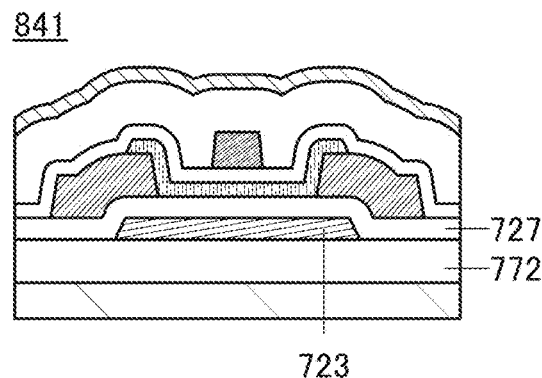

FIG. 11A1
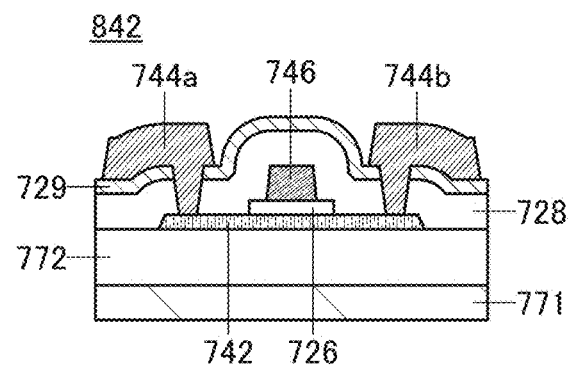
FIG. 11A2
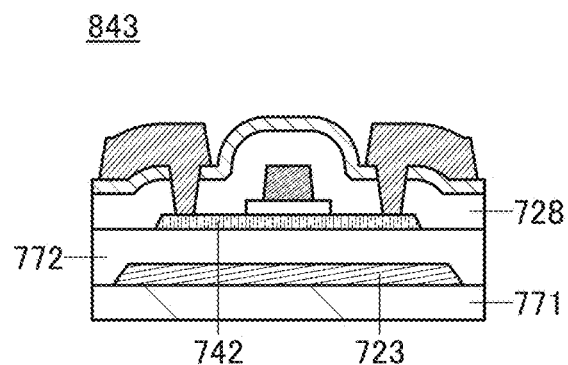
FIG. 11A3
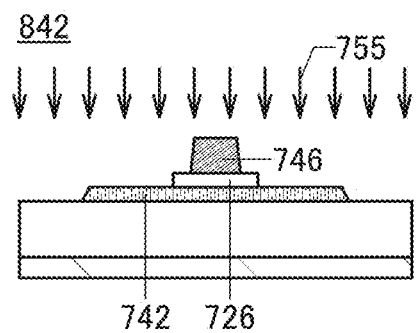
FIG. 11B1
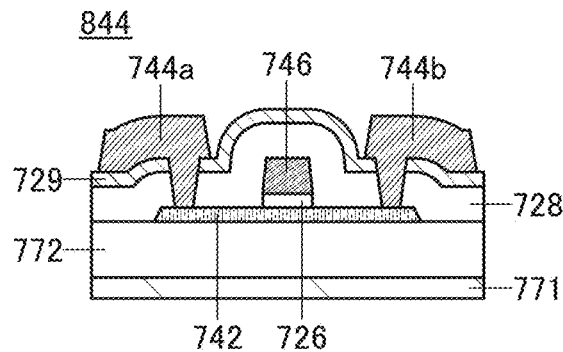
FIG. 11B2
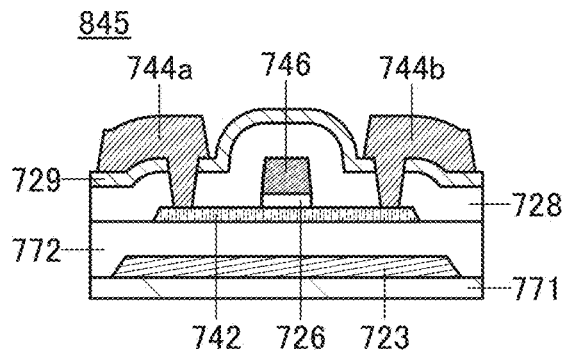
FIG. 11C1
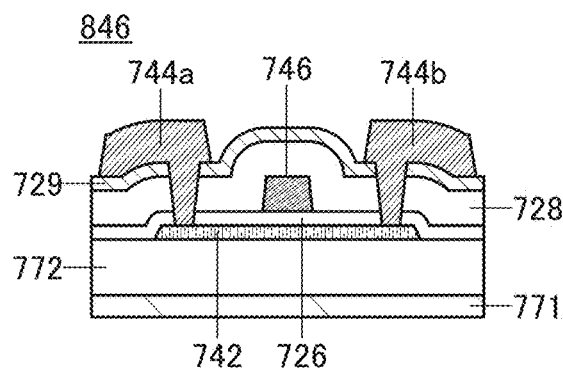
FIG. 11C2
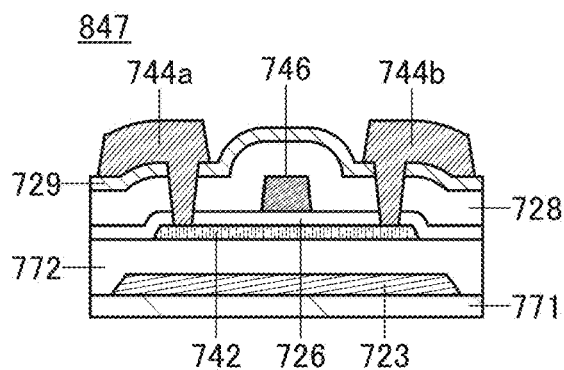

FIG. 15A
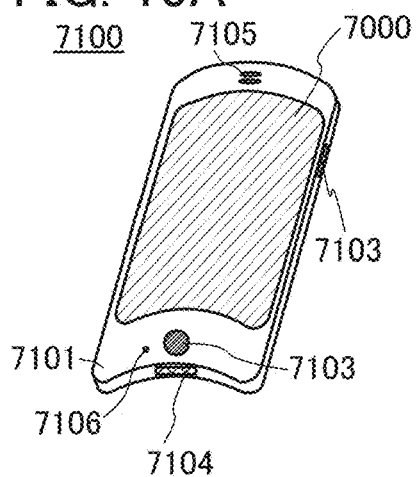
FIG. 15B
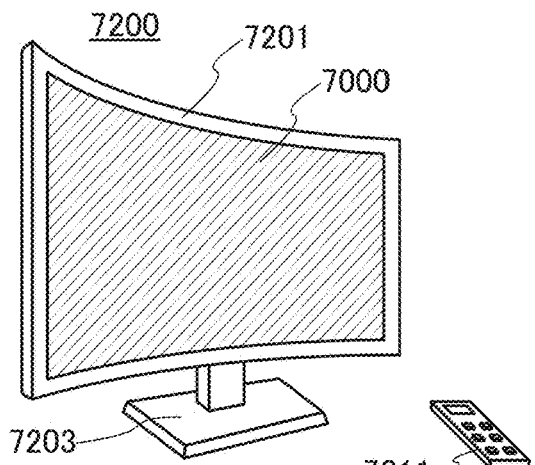
FIG. 15C1
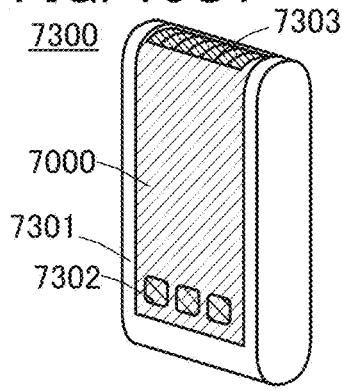
FIG. 15D
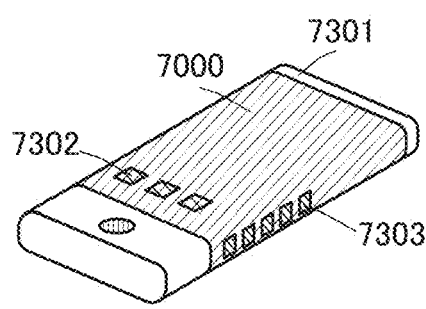
FIG. 15E
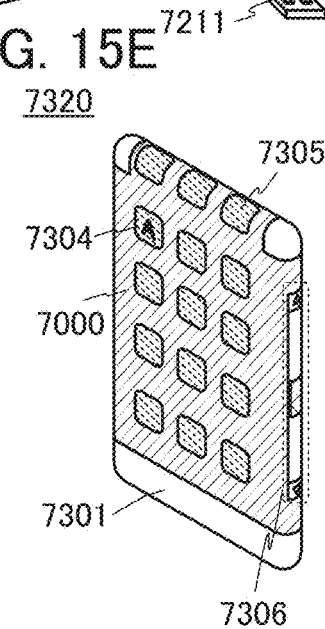
FIG. 15C2
FIG. 15F
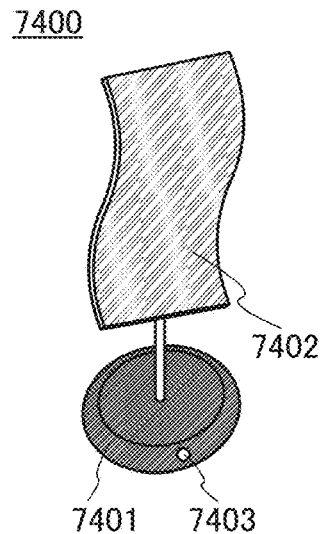
FIG. 15G
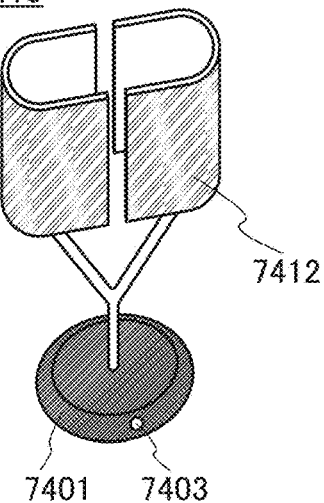
FIG. 15H
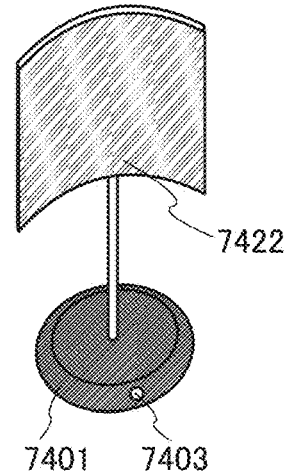

FIG. 16A1
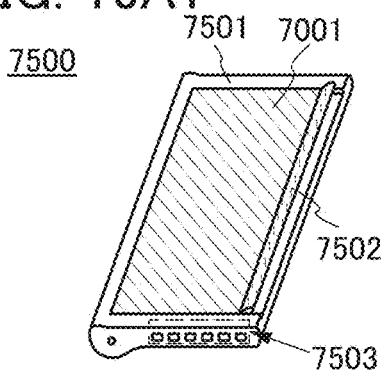
FIG. 16B
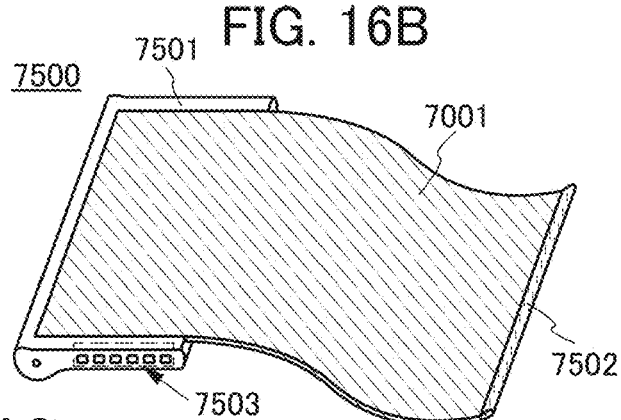
FIG. 16A2
FIG. 16C
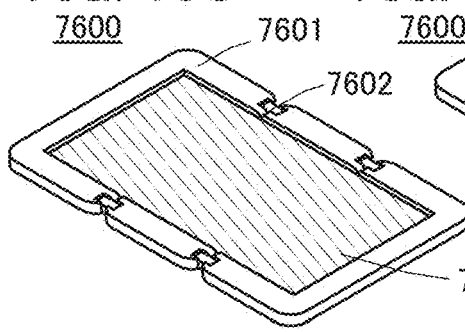
FIG. 16D
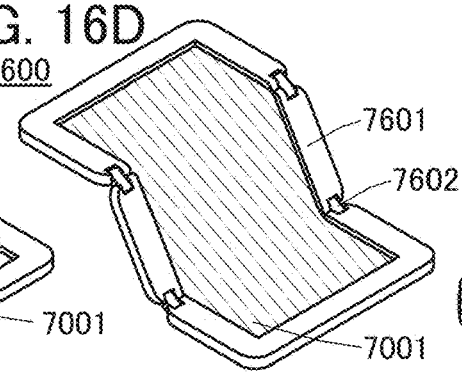
FIG. 16E
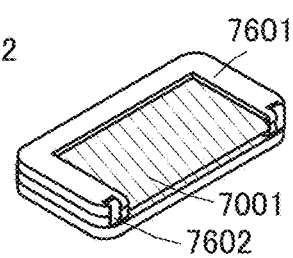
FIG. 16F
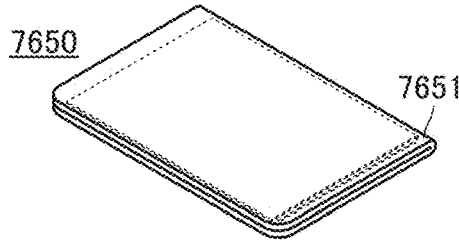
FIG. 16G
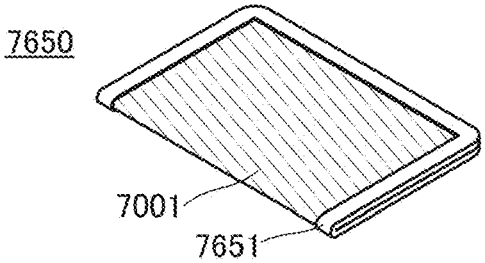
FIG. 16H
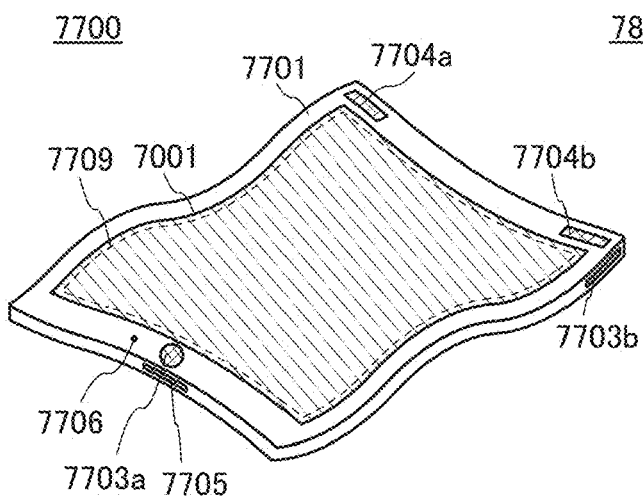
FIG. 16I
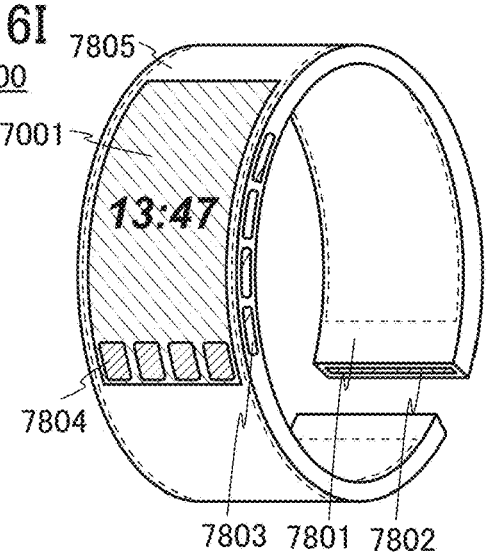

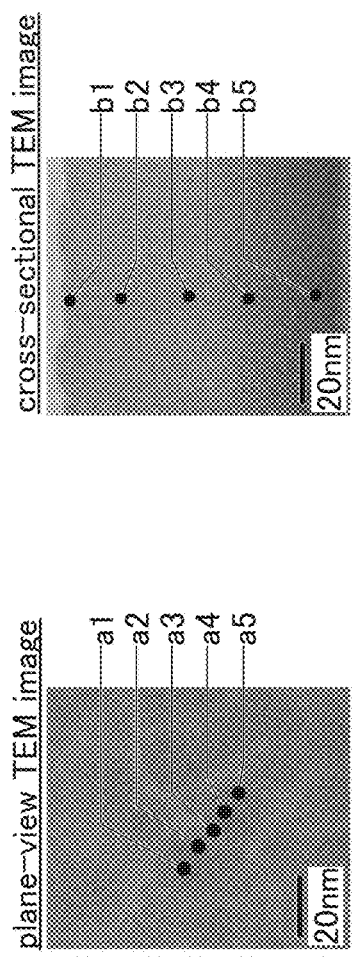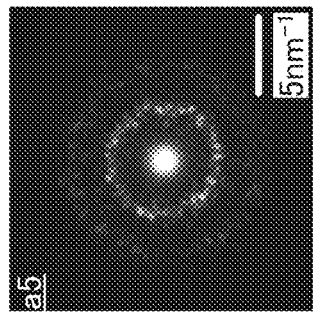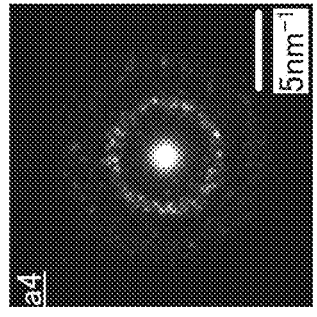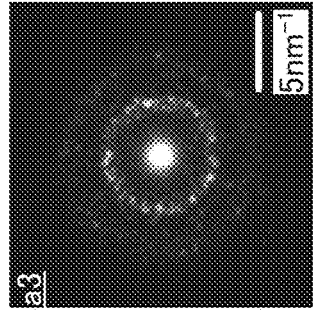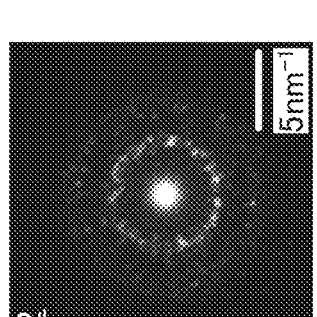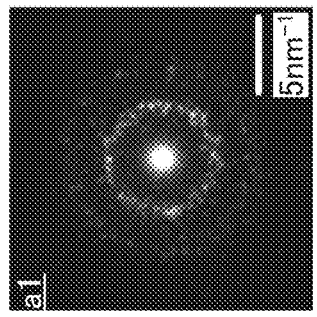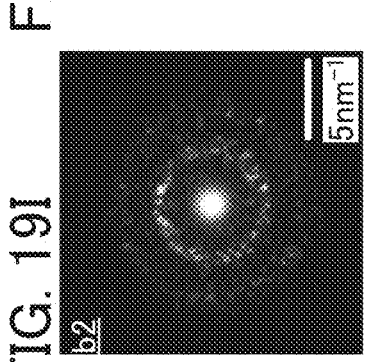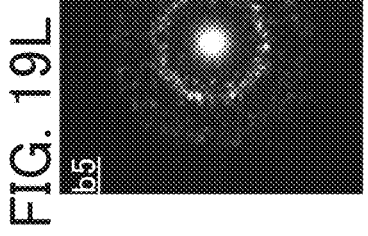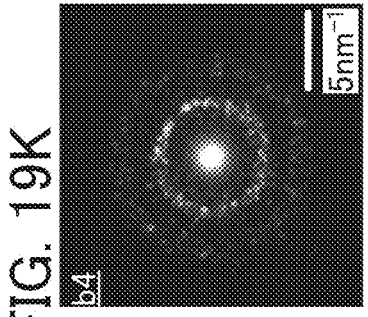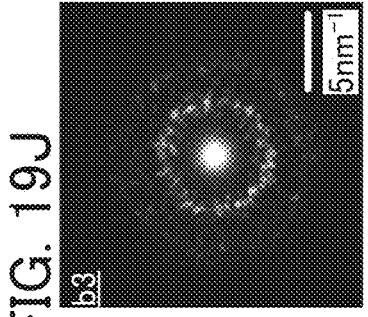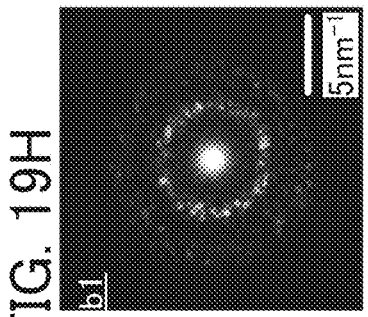

DISPLAY DEVICE WITH HIGH VISIBILITY REGARDLESS OF ILLUMINANCE OF EXTERNAL LIGHT

BACKGROUND OF THE INVENTION

1. Field of the Invention

One embodiment of the present invention relates to a display device.

Note that one embodiment of the present invention is not limited to the above technical field. Examples of the technical field of one embodiment of the present invention disclosed in this specification include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device means all types of devices that can function by utilizing semiconductor characteristics; a transistor, a semiconductor circuit, an arithmetic unit, a memory device, an imaging device, an electro-optical device, a power generation device (e.g., a thin film solar cell and an organic thin film solar cell), an electronic device, and the like are each an embodiment of the semiconductor device.

2. Description of the Related Art

A display device in which a light-emitting device including a light-emitting element such as an organic electroluminescent (EL) element or a light-emitting diode (LED) is used has been known. In addition, a display device in which a liquid crystal element is used has also been known. Furthermore, an electronic paper performing display by an electrophoretic method or the like can be given as an example of a display device.

For example, in a basic structure of an organic EL element, a layer containing a light-emitting organic compound is provided between a pair of electrodes. By voltage application to this element, the light-emitting organic compound can emit light. A display device including such an organic EL element can be thin and lightweight and have high contrast and low power consumption.

Patent Document 1 discloses a flexible light-emitting device in which an organic EL element is used.

REFERENCE

Patent Document

[Patent Document 1] Japanese Published Patent Application No. 2014-197522

SUMMARY OF THE INVENTION

In some cases, the visibility of a display device largely depends on the illuminance of external light in an environment where the display device is used. For example, in an environment where the illuminance of external light is high, a user feels that the luminance of a display device is low and an image having predetermined luminance is difficult to see; in contrast, in an environment where the illuminance of external light is low, a user feels that the luminance of the display device is high and an image having the predetermined luminance is too bright.

An object of one embodiment of the present invention is to provide a display device having high visibility regardless of the illuminance of external light. Another object is to provide a display device with reduced power consumption. Another object is to provide a display device or an electronic device with a reduced number of components. Another object is to provide a highly reliable display device.

Note that the descriptions of these objects do not disturb the existence of other objects. In one embodiment of the present invention, there is no need to achieve all the objects. Note that other objects can be derived from the description of the specification, the drawings, the claims, and the like.

One embodiment of the present invention is a display device including a first light-receiving circuit including a first light-receiving element; and a pixel circuit including a display element. The gray level of the display element is changed according to a change in the amount of light to which the first light-receiving element is exposed.

In the above, the gray level of the display element is preferably decreased with a decrease in the amount of light to which the first light-receiving element is exposed.

In the above, the display element is preferably a light-emitting element or a liquid crystal element.

In the above, the pixel circuit and the first light-receiving circuit are preferably over the same substrate.

Another embodiment of the present invention is a display device including a first light-receiving circuit; and a pixel circuit. The first light-receiving circuit includes a first light-receiving element; and a first transistor connected to the first light-receiving element in series. The pixel circuit includes a light-emitting element; and a second transistor connected to the light-emitting element in series. The second transistor includes a first gate; and a second gate. A first node between the first light-receiving element and the first transistor is electrically connected to one of the first gate and the second gate of the second transistor.

Another embodiment of the present invention is a display device including a first light-receiving circuit; and a pixel circuit. The first light-receiving circuit includes a first light-receiving element; and a first transistor connected to the first light-receiving element in series. The pixel circuit includes a liquid crystal element; and a third transistor connected to the liquid crystal element in series. A first node between the first light-receiving element and the first transistor and a third node between the third transistor and the liquid crystal element are electrically connected to each other.

The first light-receiving circuit preferably includes a fourth transistor connected between the first light-receiving element and the first transistor in series. At this time, the first node is a node between the first transistor and the fourth transistor. The potential of the first node is updated to a potential corresponding to the amount of light to which the first light-receiving element is exposed when the first transistor is off and the fourth transistor is on. The potential of the first node is held when the first transistor and the fourth transistor are off.

The fourth transistor preferably includes an oxide semiconductor in a semiconductor where a channel is formed. The first transistor preferably includes an oxide semiconductor in a semiconductor where a channel is formed.

In the above, the display device preferably further includes a second light-receiving circuit including a second light-receiving element; and a circuit. The second light-receiving circuit is configured to output a signal based on the amount of light to which the second light-receiving element is exposed. The circuit is configured to detect a touch operation on the basis of the signal.

According to one embodiment of the present invention, a display device having high visibility regardless of the illuminance of external light can be provided. According to one embodiment of the present invention, a display device with reduced power consumption can be provided. According to one embodiment of the present invention, a display device or an electronic device with a reduced number of components can be provided. According to one embodiment of the present invention, a highly reliable display device can be provided.

One embodiment of the present invention does not necessarily achieve all the effects listed above. Other effects can be derived from the description of the specification, the drawings, the claims, and the like.

BRIEF DESCRIPTION OF THE DRAWINGS

FIGS. 9A1, 9A2, 9B1, 9B2, 9C1, and 9C2 are cross-sectional views each illustrating one mode of a transistor.

FIGS. 10A1, 10A2, 10A3, 10B1, and 10B2 are cross-sectional views each illustrating one mode of a transistor.

FIGS. 11A1, 11A2, 11A3, 11B1, 11B2, 11C1, and 11C2 are cross-sectional views illustrating embodiments of transistors.

FIGS. 15A to 15H each illustrate an electronic device of one embodiment.

FIGS. 16A1, 16A2, 16B, 16C, 16D, 16E, 16F, 16G, 16H, and 16I illustrate electronic devices of embodiments.

FIGS. 19A and 19B are TEM images of samples and FIGS. 19C to 19L are electron diffraction patterns thereof.

DETAILED DESCRIPTION OF THE INVENTION

Figure 1A:
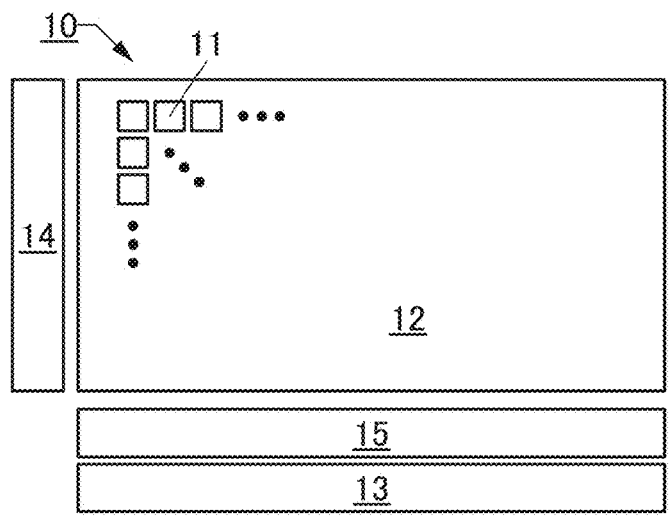
FIGS. 1A to 1C illustrate a display device of one embodiment.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, the ordinal numbers such as "first" and "second" are used in order to avoid confusion among components, and the terms do not limit the components numerically.

A transistor is a kind of semiconductor element and can achieve amplification of current or voltage, the switching operation for controlling conduction or non-conduction, or the like. A transistor in this specification includes an insulated-gate field-effect transistor (IGFET) and a thin film transistor (TFT).

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

In this specification and the like, one of a source and a drain of a transistor is referred to as a "first electrode" and the other of the source and the drain is referred to as a "second electrode" in some cases. Note that a gate is also referred to as a "gate" or a "gate electrode".

Note that in this specification and the like, two electrodes of a diode are referred to as a "first electrode" and a "second electrode", a "first terminal" and a "second terminal", or an "anode" and a "cathode" in some cases. Here, a direction in which current flows from the first electrode to the second electrode is a forward direction of the diode and its opposite direction is an opposite direction of the diode. In addition, one of the electrodes is simply referred to as a "terminal", "one end", "one", or the like in some cases.

In this specification and the like, two terminals of a two-terminal element such as a coil, a resistor, or a capacitor are referred to as a "first terminal" and a "second terminal" or a "first electrode" and a "second electrode" in some cases. In addition, one of the terminals is simply referred to as a "terminal", "electrode", "one end", "one", or the like in some cases.

Note that in this specification and the like, the expressions "connected" and "electrically connected" include the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, a coil, a capacitor, and an element with a variety of functions in addition to an electrode and a wiring.

Note that in this specification and the like, a node means an element (e.g., a wiring) which enables electrical connection between elements included in a circuit. Therefore, a "node to which A is connected" is a wiring which is electrically connected to A and can be regarded as having the same potential as A. Even when one or more elements which enable electrical connection (e.g., switches, transistors, capacitors, inductors, resistors, or diodes) are in a portion of the wiring, the wiring can be regarded as the "node to which A is connected" as long as it has the same potential as A.

Note that in this specification and the like, an EL layer means a layer provided between a pair of electrodes of a light-emitting element, and specifically means a layer containing at least a light-emitting substance (also referred to as a light-emitting layer), or a stack including the light-emitting layer.

Note that in this specification and the like, a display panel has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing contact or approach of an object such as a finger or a stylus; hence, the touch sensor is one embodiment of an input device.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel has a function of displaying (outputting) an image or the like on (to) a display surface and a function as a touch sensor capable of sensing contact or approach of an object such as a finger or a stylus on or to the display surface. Therefore, the touch panel is one embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel.

In this specification and the like, a structure in which a connector such as an FPC or a TCP is attached to a substrate of a touch panel, or a structure in which an IC is mounted on a substrate by a COG method or the like is referred to as a touch panel module or a display module, or simply referred to as a touch panel or the like in some cases.

(Embodiment 1)

In this embodiment, a structure example of a display device of one embodiment of the present invention and a driving method thereof will be described.

[Structure Example of Display Device]

FIG. 1A is a block diagram of a display device 10 of one embodiment of the present invention. The display device 10 includes a display region 12, a circuit 13, a circuit 14, and a circuit 15. In the display region 12, a plurality of pixel units 11 are arranged.

Figure 1B:
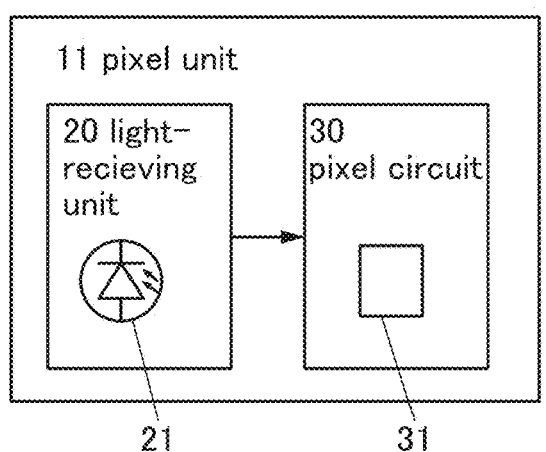

FIG. 1B illustrates the configuration of the pixel unit 11. The pixel unit 11 includes a light-receiving circuit 20 and a pixel circuit 30. The light-receiving circuit 20 includes at least a light-receiving element 21. The pixel circuit 30 includes at least a display element 31.

As the display element 31, typically, a light-emitting element such as an organic EL element, a liquid crystal element, or the like can be used.

The circuit 13 and the circuit 14 are each a circuit for supplying a signal, a power supply potential, or the like to the pixel circuit 30. For example, a circuit functioning as a signal line driver circuit can be used as one of the circuit 13 and the circuit 14, and a circuit functioning as a scan line driver circuit can be used as the other thereof.

The circuit 15 is a circuit for supplying a signal, a power supply potential, or the like to the light-receiving circuit 20. The light-receiving circuit 20 can be driven on the basis of a signal supplied from the circuit 15. As the circuit 15, a circuit suitable for the configuration of the pixel unit 11 can be used. In the case where a signal for driving the light-receiving circuit 20 is not particularly necessary, the circuit 15 is not necessarily provided. For example, in the case where a signal or a power supply potential for driving the pixel circuit 30 can be used also for the light-receiving circuit 20, the circuit 15 is not necessarily provided.

The light-receiving circuit 20 and the pixel circuit 30 are electrically connected to each other. As illustrated in FIG. 1B, the light-receiving circuit 20 has a function of outputting, to the pixel circuit 30, a signal corresponding to the amount of light to which the light-receiving element 21 is exposed (i.e., the amount of light received by the light-receiving element 21). The pixel circuit 30 can change the gray level of the display element 31 in response to the signal. That is, the intensity of light from the display element 31 can be changed. Here, light from the display element 31 means light emitted from the display element 31 in the case where the display element 31 is a self-luminous element, and means light emitted to the outside through the display element 31 in the case where the display element 31 is an optical element utilizing an optical phenomenon other than light emission (e.g., light polarization, light reflection, light transmission, light refraction, light diffraction, light scattering, or light absorption).

As the display element, a light-emitting element such as an LED, an organic light-emitting diode (OLED), or a quantum-dot light-emitting diode (QLED), an optical element such as a liquid crystal element, or an element whose luminance is controlled by current or voltage can be used.

Furthermore, a micro electro mechanical systems (MEMS) element, an electron emitter, another optical element, or the like can be used as the display element.

Examples of MEMS display elements include a MEMS shutter display element, an optical interference type MEMS display element, and the like. A carbon nanotube may be used for the electron emitter. As an example of another optical element, an element using a microcapsule method, an electrophoretic method, an electrowetting method, an Electronic Liquid Powder (registered trademark) method, or the like can be given.

Figure 1C:
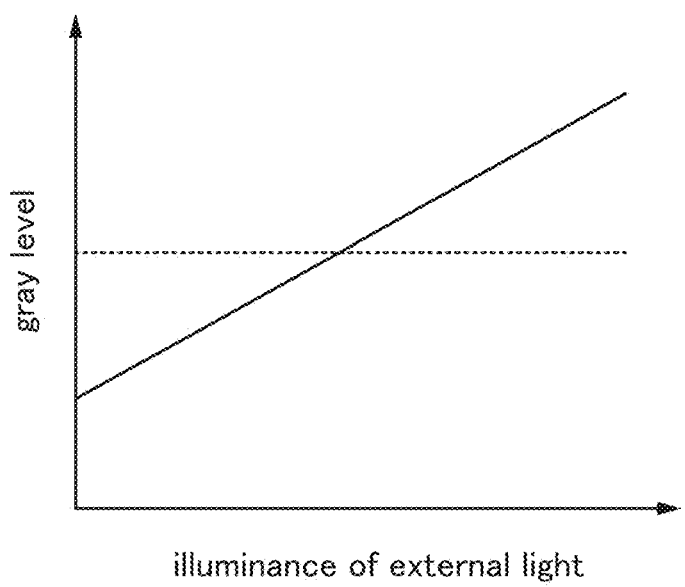

FIG. 1C shows a change in the gray level of the display element 31 with respect to the illuminance of external light. In the graph, a solid line corresponds to the case of the display device 10 of one embodiment of the present invention, and a dashed line corresponds to the case where display with a certain gray level is performed regardless of the illuminance of external light.

The amount of light received by the light-receiving element 21 increases in proportion to the illuminance of external light. The display device 10 operates such that the gray level of the display element 31 is increased depending on the illuminance of external light. That is, in the case where the illuminance of external light is high, the gray level of the display element 31 is increased in order that the display device 10 performs display with high luminance; in the case where the illuminance of external light is low, the gray level of the display element 31 is decreased in order that the display device 10 performs display with low luminance. Consequently, a user can always see a displayed image or the like with optimum luminance regardless of the illuminance of external light to which the display device 10 is exposed. Note that image processing using a processor or the like is not needed; the display device 10 can execute such a process of converting a gray level by itself.

Since the plurality of pixel units 11 including the light-receiving circuits 20 are arranged in the display region 12, a gray level can be corrected depending on the illuminance of external light in each of the pixel units 11 in the display region 12. As a result, a gray level is not corrected in the whole display region 12; that is, in a plurality of portions in the display region 12, gray levels can be corrected independently. For example, it is possible to perform display with high luminance only in a portion which is exposed to external light locally in the display region 12.

A more specific example of the pixel unit 11 will be described below.

[Configuration Example 1 of Pixel Unit 11]

Figure 2A:
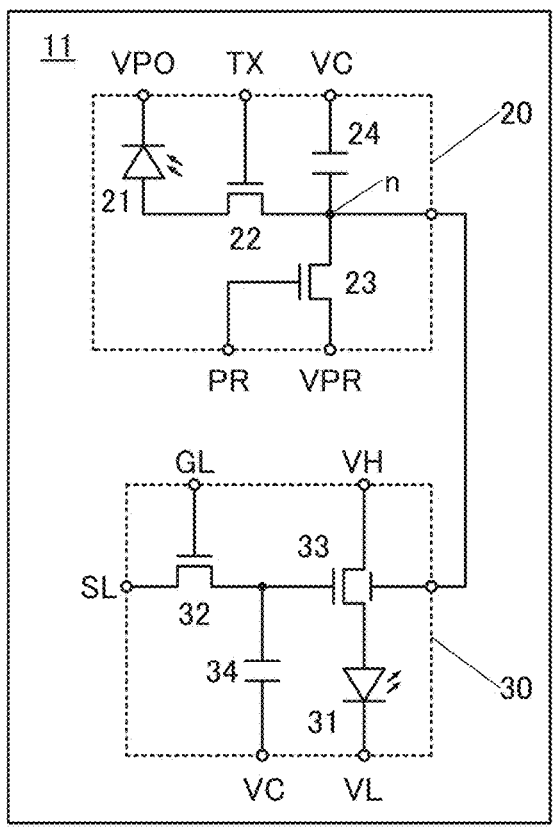
FIGS. 2A to 2C illustrate a display device of one embodiment.

FIG. 2A is an example of a circuit diagram of the pixel unit 11. In the pixel unit 11, the light-receiving circuit 20 and the pixel circuit 30 are electrically connected to each other. In this configuration example, a light-emitting element is used as the display element 31 in the pixel circuit 30. In a circuit illustrated in FIG. 2A or the like, various elements whose gray levels are changed depending on current flowing therethrough or voltage applied thereto can be used as well as a light-emitting element.

The light-receiving circuit 20 includes the light-receiving element 21, a transistor 22, a transistor 23, and a capacitor 24. A cathode of the light-receiving element 21 is connected to a wiring VPO, and an anode of the light-receiving element 21 is connected to one of a source and a drain of the transistor 22. A gate of the transistor 22 is connected to a wiring TX, and the other of the source and the drain of the transistor 22 is connected to one of a source and a drain of the transistor 23 and one electrode of the capacitor 24. A gate of the transistor 23 is connected to a wiring PR, and the other of the source and the drain of the transistor 23 is connected to a wiring VPR. The other electrode of the capacitor 24 is connected to a wiring VC. Note that a node where the other of the source and the drain of the transistor 22, the one of the source and the drain of the transistor 23, and the one electrode of the capacitor 24 are connected to each other is referred to as a node n.

The pixel circuit 30 includes the display element 31, a transistor 32, a transistor 33, and a capacitor 34. The transistor 33 includes a first gate and a second gate. A cathode of the display element 31 is connected to a wiring VL, and an anode of the display element 31 is connected to one of a source and a drain of the transistor 33. A gate of the transistor 32 is connected to a wiring GL, one of a source and a drain of the transistor 32 is connected to a wiring SL, and the other of the source and the drain of the transistor 32 is connected to one electrode of the capacitor 34 and the first gate of the transistor 33. The other of the source and the drain of the transistor 33 is connected to a wiring VH, and the second gate of the transistor 33 is connected to the node n of the light-receiving circuit 20. The other electrode of the capacitor 34 is connected to the wiring VC.

In the light-receiving circuit 20, the wiring VPO and the wiring VPR are supplied with a potential $V_{VPO}$ and a potential $V_{VPR}$, respectively. The wiring TX and the wiring PR are each supplied with a signal from the circuit 15. Here, the potential $V_{VPO}$ is preferably higher than the potential $V_{VPR}$.

In the pixel circuit 30, the wiring GL is supplied with a signal from one of the circuit 13 and the circuit 14, and the wiring SL is supplied with a signal from the other thereof. For example, the wiring GL is supplied with a scan signal, and the wiring SL is supplied with a video signal. The wiring VH, the wiring VL, and the wiring VC are each supplied with a predetermined potential. The potential supplied to the wiring VH is higher than the potential supplied to the wiring VL. Note that the magnitude relation between these potentials may be inverted depending on the direction of the diode characteristics of the display element 31. Furthermore, the display element 31 may be connected between the transistor 33 and the wiring VH.

In the example of FIG. 2A, the capacitor 24 in the light-receiving circuit 20 and the capacitor 34 in the pixel circuit 30 are each connected to the wiring VC; however, they may be connected to different wirings. The different wirings may be supplied with the same potential or different potentials. Note that the capacitor 24 is a capacitor for holding the potential of the node n; the capacitor 24 is not necessarily provided when a capacitance component such as a wiring capacitance of the node n is utilized.

Next, an example of a driving method of the pixel unit 11 will be described with reference to FIGS. 2B and 2C. In the example shown here, the transistor 22, the transistor 23, the transistor 32, and the transistor 33 are each an n-channel transistor.

Figure 2B:
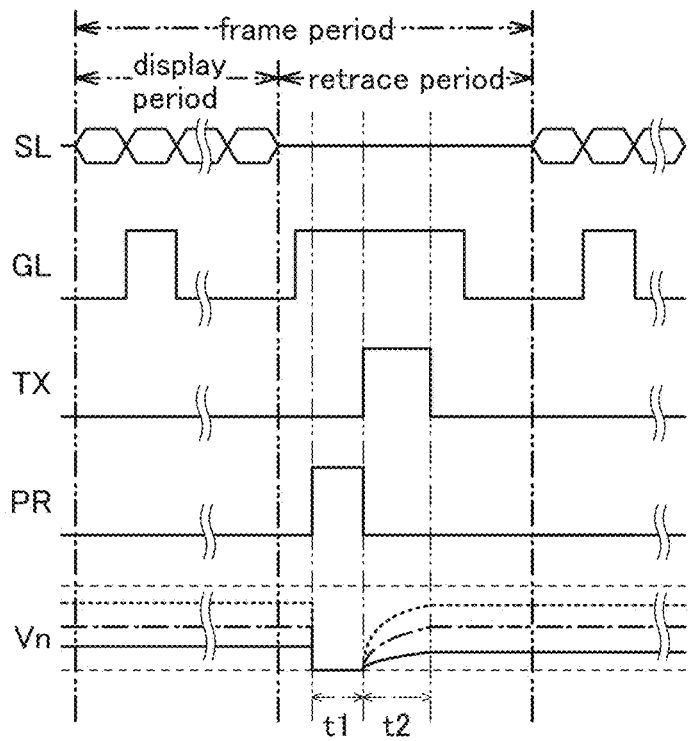

FIG. 2B is a timing chart showing the operation of the pixel unit 11. FIG. 2C schematically shows a current ($I_{ds}$) flowing between the source and the drain of the transistor 33 with respect to a voltage ($V_{gs}$) applied between the first gate and the source of the transistor 33. In FIG. 2C, $V_{gs}$ is plotted on a linear scale on the horizontal axis, and a square root of $I_{ds}$ ($\sqrt{I_{ds}}$) is plotted on a linear scale on the vertical axis.

As shown in FIG. 2B, a display period and a retrace period are provided in a frame period. The display period is a period during which data in the pixel circuit 30 is updated (rewritten). The retrace period is a period provided between two display periods.

In the display period, a high-level potential is supplied to the wiring GL to select the pixel circuit 30, and thus the transistor 32 is turned on and a potential corresponding to a signal input to the wiring SL is supplied to the first gate of the transistor 33 and the one electrode of the capacitor 34 through the transistor 32. After that, a low-level potential is supplied to the wiring GL, and thus the transistor 32 is turned off. The conduction state of the transistor 33 is changed depending on the potential supplied to the first gate of the transistor 33, and the amount of current flowing through the display element 31 can be controlled. Accordingly, the gray level of the display element 31 can be controlled.

Next, in the retrace period, the high-level potential is supplied to the wiring GL first, and thus the transistor 32 is turned on. At this time, the wiring SL is preferably supplied with a low-level potential, i.e., a potential for turning off the transistor 33, in which case the display element 31 performs display with the lowest gray level. At this time, a black image is displayed on the whole display region 12 in the display device 10. Alternatively, the signal input to the wiring SL may be changed in order to display an image of a single color (i.e., white, red, green, or blue) on the whole display region 12 in the retrace period. In that case, a period during which a black image is displayed on the whole display region 12 is preferably provided after a period t2 in the retrace period.

Then, in a period t1 shown in FIG. 2B, the wiring PR is supplied with a high-level potential for turning on the transistor 23. Accordingly, the potential of the node n becomes close to the potential $V_{VPR}$. That is, the potential of the node n can be reset (initialized). Specifically, the potential of the node n becomes a value obtained by subtracting the threshold voltage of the transistor 23 from the potential $V_{VPR}$.

Next, in a period t2 shown in FIG. 2B, the wiring TX is supplied with a high-level potential for turning on the transistor 22, and the wiring PR is supplied with a low-level potential for turning off the transistor 23.

In the initial stage of the period t2, a potential $V_n$ of the node n is kept close to the potential $V_{VPR}$, and the potential $V_{VPO}$ supplied to the wiring VPO is higher than the potential $V_n$. At this time, the transistor 22 is on, and thus a reverse bias voltage is applied to the light-receiving element 21.

When light enters the light-receiving element 21 in the state where the reverse bias voltage is applied to the light-receiving element 21, current flows from the cathode to the anode of the light-receiving element 21. The current value varies depending on the intensity of light, that is, the amount of light to which the light-receiving element 21 is exposed (i.e., the amount of light received by the light-receiving element 21). Specifically, the larger the amount of light to which the light-receiving element 21 is exposed is, the larger the current value becomes and the larger the amount of charge flowing into the node n becomes. In contrast, the smaller the amount of light to which the light-receiving element 21 is exposed is, the smaller the current value becomes and the smaller the amount of charge flowing into the node n becomes. Accordingly, the larger the amount of light to which the light-receiving element 21 is exposed is, the larger a change in the potential of the node n becomes. In contrast, the smaller the amount of light to which the light-receiving element 21 is exposed is, the smaller a change in the potential of the node n becomes.

In FIG. 2B, a solid line, a dashed-dotted line, and a dashed line are used for showing examples of the potential $V_n$ of the node n; the amount of light to which the light-receiving element 21 is exposed is the smallest in the case of the solid line, is the largest in the case of the dashed line, and is intermediate therebetween in the case of the dashed-dotted line. The smaller the amount of light exposure is, the closer to the potential $V_{VPR}$ the potential $V_n$ of the node n becomes, which is indicated by the solid line; the larger the amount of light exposure is, the closer to the potential $V_{VPO}$ the potential $V_n$ of the node n becomes, which is indicated by the dashed line.

Then, the wiring TX is supplied with a low-level potential for turning off the transistor 22. Consequently, after that, the potential $V_n$ of the node n is held.

With such an operation, the potential of the node n can be reset in the period t1 provided in the retrace period, and the potential of the node n can be updated in the following period t2. Therefore, even in the case where the illuminance of external light with which the display device 10 is irradiated is changed, the illuminance can always be monitored.

Here, in the period t2 during which the potential of the wiring PR is the low-level potential and the potential of the wiring TX is the high-level potential, the potential $V_n$ of the node n is kept changing. Therefore, when the length of the period t2 is too long, a difference in the potential $V_n$ of the node n with respect to different amounts of light exposure becomes small. Also when the length of the period t2 is too short, a difference in the potential $V_n$ of the node n with respect to different amounts of light exposure becomes small. For such a reason, the length of the period t2 is determined in consideration of the sensitivity and electrical characteristics of the light-receiving element 21, the upper limit and lower limit of the illuminance of external light in an expected usage environment, the potentials of the wiring VPO and the wiring VPR, the time constant of the node n, the electrical characteristics of the transistor 33, the upper limit and lower limit of the amount of change in gray level, or the like.

The node n is connected to the second gate of the transistor 33. For such a reason, the threshold voltage of the transistor 33 in the case of driving with the use of the first gate is changed according to the potential $V_n$ of the node n.

Figure 2C:
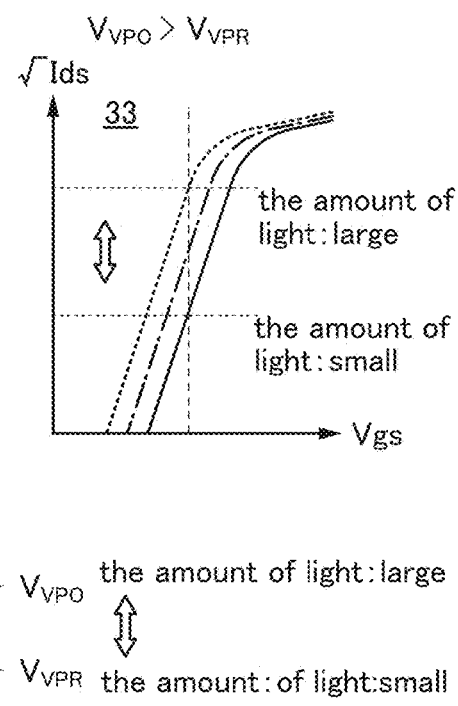

In FIG. 2C, a solid line, a dashed-dotted line, and a dashed line are used for showing the $V_{gs}$-$I_{ds}$ characteristics of the transistor 33; the amount of light to which the light-receiving element 21 is exposed is the smallest in the case of the solid line, is the largest in the case of the dashed line, and is intermediate therebetween in the case of the dashed-dotted line. The smaller the amount of light exposure is, the lower the potential $V_n$ of the node n becomes; the threshold voltage in this case is positioned on the positive side as indicated by the solid line. The larger the amount of light exposure is, the higher the potential $V_n$ of the node n becomes; the threshold voltage in this case is positioned on the negative side as indicated by the dashed line. From the above, when the first gate of the transistor 33 is supplied with a certain potential, the amount of current flowing between the source and the drain of the transistor 33 is smaller in the case where the amount of light exposure is smaller, and is larger in the case where it is larger. As a result, the smaller the amount of light exposure is, the lower the luminance of light emitted from the display element 31 becomes; the larger the amount of light exposure is, the higher the luminance of light emitted from the display element 31 becomes.

In a place where external light is intense, the luminance of the display device 10 including the pixel units 11 is increased and thus visibility is improved. In contrast, in a place where external light is weak, the luminance thereof is decreased and thus eye-friendly display can be performed. The luminance of the display device 10 can be adjusted according to the intensity of external light, so that the power consumption of the display device 10 can be reduced. Such functions of the display device 10 can be achieved without using an external arithmetic device, a special IC, or the like. In other words, such function of the display device 10 can be achieved without an increase in the number of components of the display device 10 or an electronic device including the display device 10.

Here, the fluctuation range of the threshold voltage of the transistor 33 can be defined using the potential $V_{VPO}$ and the potential $V_{VPR}$. For example, when the potential $V_{VPR}$ is set to a negative potential and the potential $V_{VPO}$ is set to a negative potential higher than the potential $V_{VPR}$, the threshold voltage of the transistor 33 shifts in the positive direction and thus the transistor 33 can be normally off. When the potential $V_{VPR}$ is set to a negative potential and the potential $V_{VPO}$ is set to a positive potential, the transistor 33 can be either normally off or normally on.

The potential $V_n$ of the node n is preferably changed as little as possible in one frame period. For example, when the transistors 22 and 23 are off, a current of approximately $0.5 \times 10^{-14}$ A flows between their sources and drains and a current of approximately $0.5 \times 10^{-14}$ A or more (e.g., a current of approximately $1.0\times10^{-14}$ A) flows through the light-receiving element 21. When the voltage between the wiring VPO and the wiring VPR is assumed to be fixed, the current flowing through the light-receiving element 21 depends on the amount of light to which the light-receiving element 21 is exposed, the current flowing between the source and the drain of the transistor 22 depends on the potential of the wiring TX, and the current flowing between the source and the drain of the transistor 23 depends on the potential of the wiring PR. At this time, the current flowing through the node n is approximately $1.0\times10^{-14}$ A in total. When the total value of capacitance of the node n is approximately $10^{-14}$ F, the potential of the node n is changed by 0.1 V in 0.1 seconds.

Here, the transistors 22 and 23 are each preferably a transistor in which an oxide semiconductor is used as a semiconductor where a channel is formed. For example, in a transistor including silicon in a channel formation region, it is difficult to control drain current to approximately $10^{-14}$ A by adjusting gate voltage. In contrast, in a transistor including an oxide semiconductor in a channel formation region, it is possible to reduce drain current to approximately $10^{-23}$ A by adjusting gate voltage. Thus, it is easy to control the potential of the node n so as not to be changed as much as possible in one frame period with the use of a transistor including an oxide semiconductor in a channel formation region as compared with the use of a transistor including silicon in a channel formation region.

Like the transistors 22 and 23, the transistors other than the transistors 22 and 23 (e.g., the transistor 32, the transistor 33, and transistors included in other circuits) are each preferably a transistor in which an oxide semiconductor is used as a semiconductor where a channel is formed.

In FIG. 2A and the like, each of the transistors other than the transistor 33 has the gate electrode only on one side of a semiconductor film. In the case where each transistor has a pair of gate electrodes between which the semiconductor film is sandwiched, potentials at the same level may be applied to the pair of gate electrodes, or a fixed potential such as a ground potential may be applied only to one of the gate electrodes. By controlling the level of a potential applied to the one of the gate electrodes, the threshold voltage of each transistor can be controlled.

Note that in FIG. 2A and the like, for the semiconductor films of the transistors 22, 23, 32 and 33, oxide semiconductors or the following semiconductors other than oxide semiconductors may be used: amorphous silicon, microcrystalline silicon, polycrystalline silicon, single crystal silicon, amorphous germanium, microcrystalline germanium, polycrystalline germanium, single crystal germanium, and the like. By using the same semiconductor material for the semiconductor films of all the transistors in the pixel unit 11, a process can be simplified.

In particular, the off-state current of each of the transistors 22, 23, and 32 is preferably small in order that charge accumulated in the nodes connected thereto can be held. A transistor in which a channel formation region is formed in a film of an oxide semiconductor having a wider band gap and lower intrinsic carrier density than silicon can have extremely smaller off-state current than a transistor formed using a normal semiconductor such as silicon or germanium, and is therefore preferably used as each of the transistors 22, 23, and 32.

[Modification Example 1]

Figure 3:
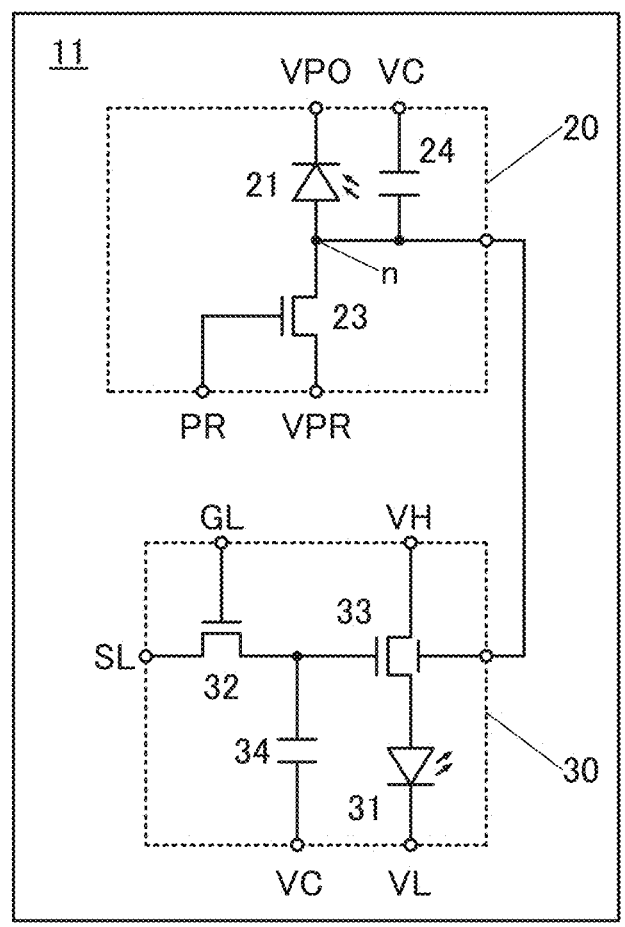
FIG. 3 illustrates a display device of one embodiment.

The example illustrated in FIG. 3 is different from the pixel unit 11 illustrated in FIG. 2A in part of the light-receiving circuit 20. Specifically, the transistor 22 in FIG. 2A is not provided and an anode of the light-receiving element 21 is connected to the node n.

In the configuration of FIG. 3, the wiring PR can be supplied with a potential for making the transistor 23 operate in a saturation region. Accordingly, the potential of the node n depends on the amount of light to which the light-receiving element 21 is exposed. Furthermore, the wiring PR can be supplied with a potential for making the transistor 23 operate in a linear region regularly (e.g., every frame); thus, the potential of the node n can be reset. Consequently, the configurations of the light-receiving circuit 20 and its peripheral circuits can be simplified.

[Modification Example 2]

Although one light-receiving circuit 20 is connected to one pixel circuit 30 in the pixel unit 11 in the above example, a configuration in which a plurality of pixel circuits 30 are connected to one light-receiving circuit 20 can also be employed.

Figure 4:
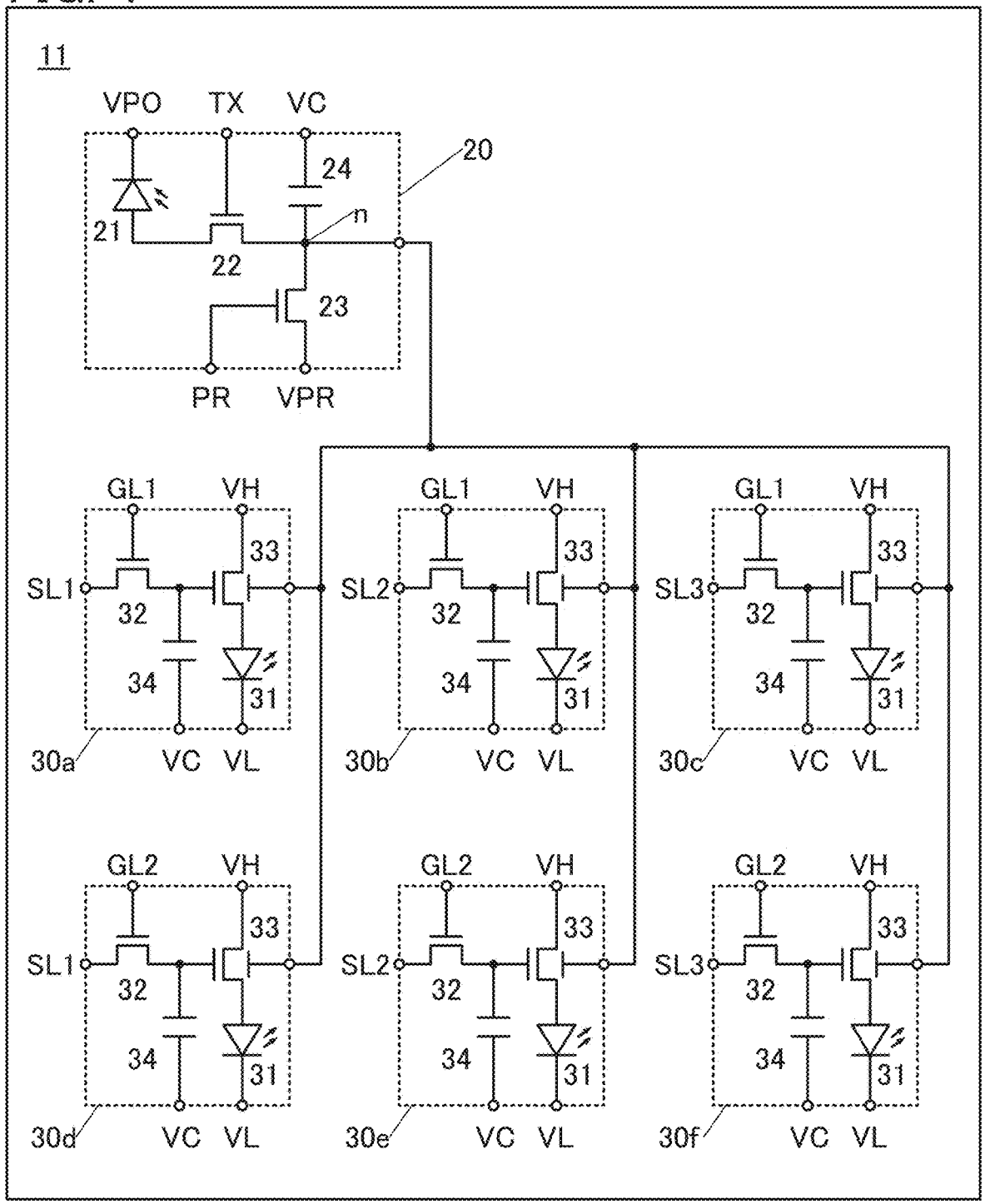
FIG. 4 illustrates a display device of one embodiment.

In the example of FIG. 4, six pixel circuits (pixel circuits 30a to 30f) are connected to the light-receiving circuit 20.

The pixel circuits 30a, 30b, and 30c share a wiring GL1. The pixel circuits 30d, 30e, and 30f share a wiring GL2. The pixel circuits 30a and 30d share a wiring SL1. The pixel circuits 30b and 30e share a wiring SL2. The pixel circuits 30c and 30f share a wiring SL3.

The node n in the light-receiving circuit 20 is connected to the second gates of the transistors 33 in the six pixel circuits (the pixel circuits 30a to 30f). For such a reason, the luminance of the display element 31 in each pixel circuit can be changed depending on a change in the potential of the node n in the light-receiving circuit 20.

[Modification Example 3]

The configuration of the pixel circuit 30 in which a light-emitting element is used as the display element 31 is not limited to that illustrated in FIG. 2A or the like, and various circuits can be used.

Figure 5A:
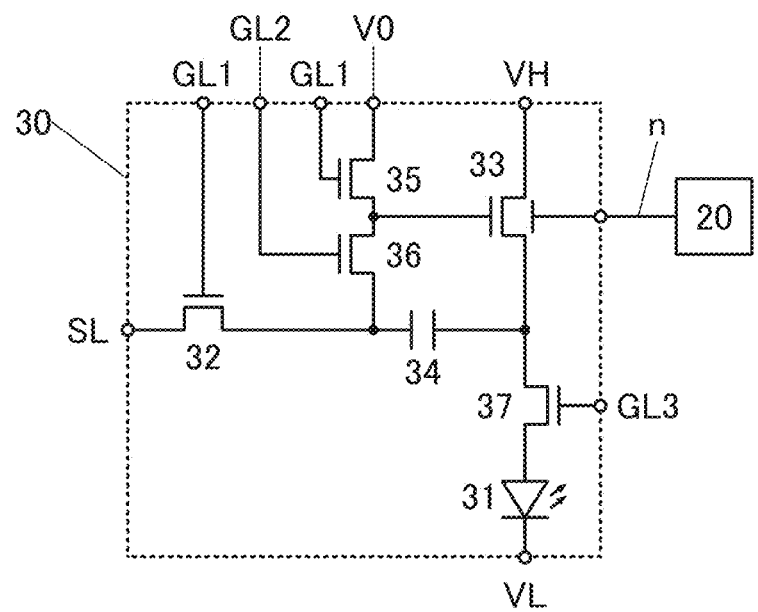
FIGS. 5A and 5B each illustrate a display device of one embodiment.

FIG. 5A illustrates an example of the pixel circuit 30 having a different configuration from the pixel circuit 30 illustrated in FIG. 2A and the like. The pixel circuit 30 illustrated in FIG. 5A includes the display element 31, the transistor 32, the transistor 33, the capacitor 34, a transistor 35, a transistor 36, and a transistor 37.

An anode of the display element 31 is connected to one of a source and a drain of the transistor 37, and a cathode of the display element 31 is connected to the wiring VL. A gate of the transistor 32 is connected to the wiring GL1, one of a source and a drain of the transistor 32 is connected to the wiring SL, and the other of the source and the drain of the transistor 32 is connected to one of a source and a drain of the transistor 36 and one electrode of the capacitor 34. A first gate of the transistor 33 is connected to one of a source and a drain of the transistor 35 and the other of the source and the drain of the transistor 36, a second gate of the transistor 33 is connected to the node n in the light-receiving circuit 20, one of a source and a drain of the transistor 33 is connected to the wiring VH, and the other of the source and the drain of the transistor 33 is connected to the other electrode of the capacitor 34 and the other of the source and the drain of the transistor 37. A gate of the transistor 35 is connected to the wiring GL1, and the other of the source and the drain of the transistor 35 is connected to a wiring V0. A gate of the transistor 36 is connected to the wiring GL2.

The wiring GL1, the wiring GL2, and a wiring GL3 are connected to one of the circuit 13 and the circuit 14. The wiring SL is connected to the other of the circuit 13 and the circuit 14. The wiring V0 is supplied with a predetermined potential (e.g., a high-level potential).

With such a configuration, even when the threshold voltage of the transistor 33 is changed over time, the change can be corrected. The pixel circuit 30 and the light-receiving circuit 20 may be driven in such a manner that, for example, the threshold voltage of the transistor 33 in the pixel circuit 30 is corrected first, and then the light-receiving circuit 20 is made to operate so that the second gate of the transistor 33 is supplied with the potential of the node n.

Figure 5B:
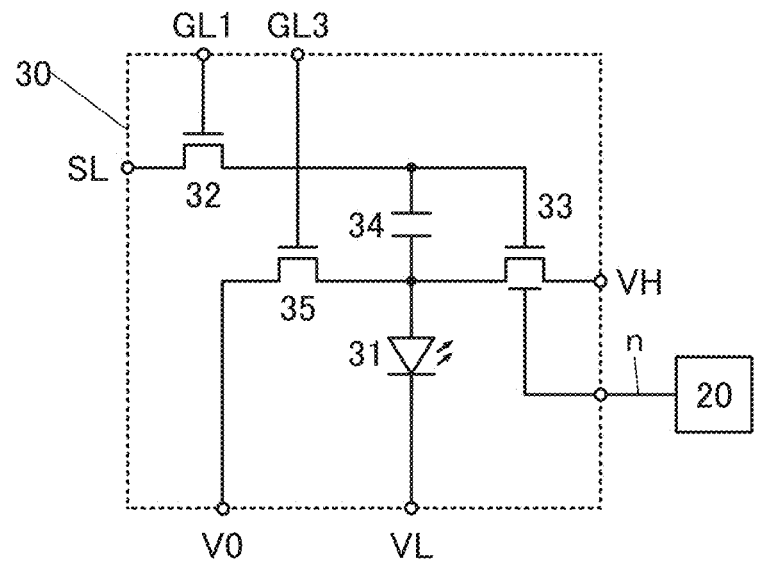

FIG. 5B illustrates the pixel circuit 30 having a different configuration. The pixel circuit 30 illustrated in FIG. 5B includes the display element 31, the transistor 32, the transistor 33, the capacitor 34, and the transistor 35.

[Configuration Example 2 of Pixel Unit 11]

A configuration example of the pixel unit 11 in which a liquid crystal element is used as the display element 31 will be described with reference to FIG. 6A. In a circuit illustrated in FIG. 6A, various elements whose gray levels are changed depending on voltage applied thereto can be used as well as a liquid crystal element.

Figure 6A:
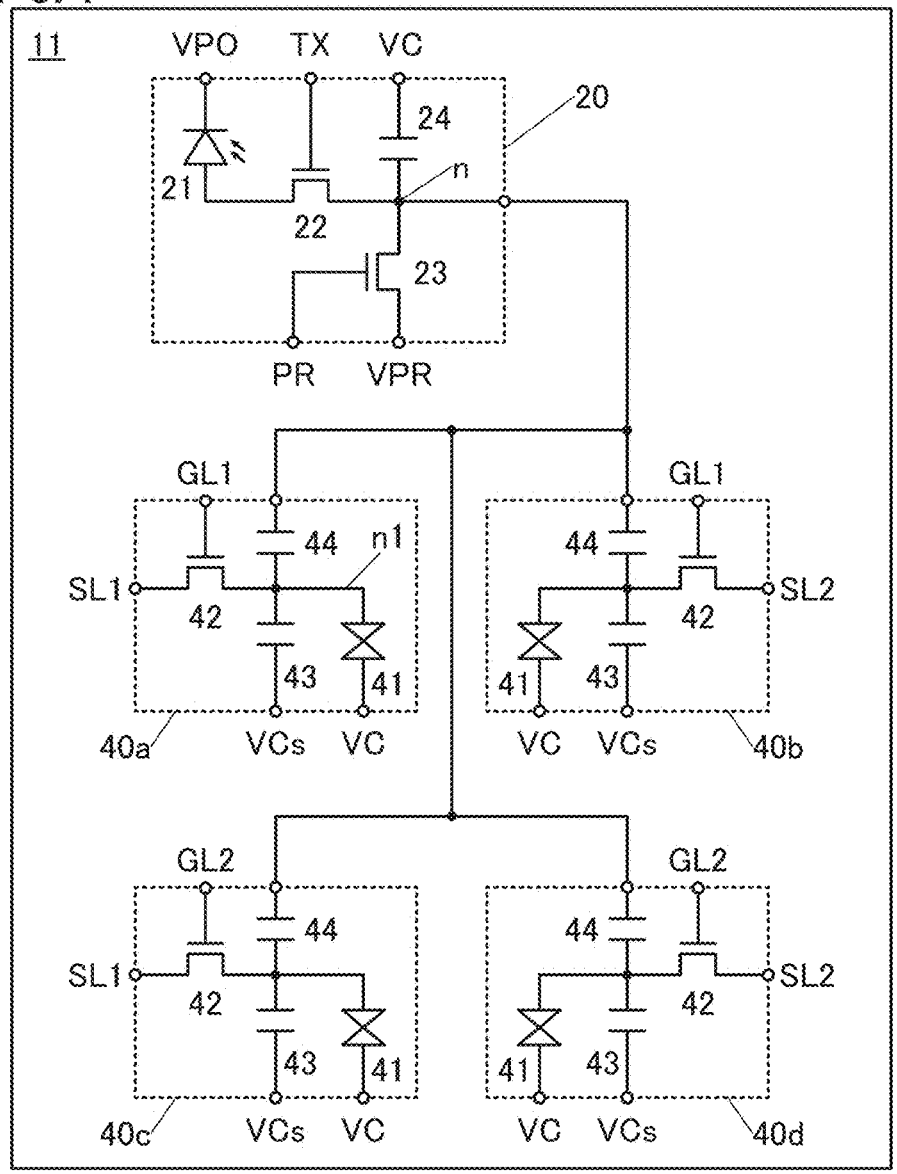
FIGS. 6A and 6B illustrate a display device of one embodiment.

In the example of FIG. 6A, four pixel circuits (pixel circuits 40a to 40d) each including a liquid crystal element 41 are connected to the light-receiving circuit 20. Note that the number of pixel circuits connected to one light-receiving circuit 20 is not limited to four.

The pixel circuit 40a includes the liquid crystal element 41, a transistor 42, a capacitor 43, and a capacitor 44. Pixel circuits 40b, 40c, and 40d each have a configuration similar to that.

In the pixel circuit 40a, one electrode of the liquid crystal element 41 is connected to one of a source and a drain of the transistor 42, one electrode of the capacitor 43, and one electrode of the capacitor 44, and the other electrode of the liquid crystal element 41 is connected to the wiring VC. A gate of the transistor 42 is connected to the wiring GL1, and the other of the source and the drain of the transistor 42 is connected to the wiring SL1. The other electrode of the capacitor 43 is connected to a wiring VCs. The other electrode of the capacitor 44 is connected to the other electrode of the capacitor 44 in each of the other pixel circuits and the node n in the light-receiving circuit 20. Here, a node to which the one electrode of the liquid crystal element 41 is connected is referred to as a node n1.

The pixel circuits 40a and 40b share the wiring GL1. The pixel circuits 40c and 40d share the wiring GL2. The pixel circuits 40a and 40c share the wiring SL1. The pixel circuits 40b and 40d share the wiring SL2. The wiring VC and the wiring VCs are each supplied with a predetermined potential.

In the pixel circuit 40a, when a video signal is input to the wiring SL1, a potential corresponding to a predetermined gray level is supplied to the node n1 through the transistor 42 that is on. A voltage between the node n1 and the wiring VC is applied to the liquid crystal element 41, so that the alignment of liquid crystal is controlled; thus, the luminance of light emitted through the liquid crystal element 41 is changed. The gray level of the liquid crystal element 41 can be controlled in this manner.

The node n in the light-receiving circuit 20 and the node n1 in the pixel circuit 40a are capacitively coupled through the capacitor 44. Therefore, when the transistor 42 is turned off and the potential of the light-receiving circuit 20 is changed in the state where the node n1 is in an electrically floating state, the potential of the node n1 is changed accordingly. As a result, voltage applied to the liquid crystal element 41 is changed, and the gray level of the liquid crystal element 41 can be changed.

In a display device including the pixel unit 11 illustrated in FIG. 6A, a correction operation using the light-receiving circuit 20 is preferably performed not in a retrace period but in a display period. The correction operation is preferably performed just after a video signal is input to each of the plurality of pixel circuits 30 connected to one light-receiving circuit 20.

Figure 6B:
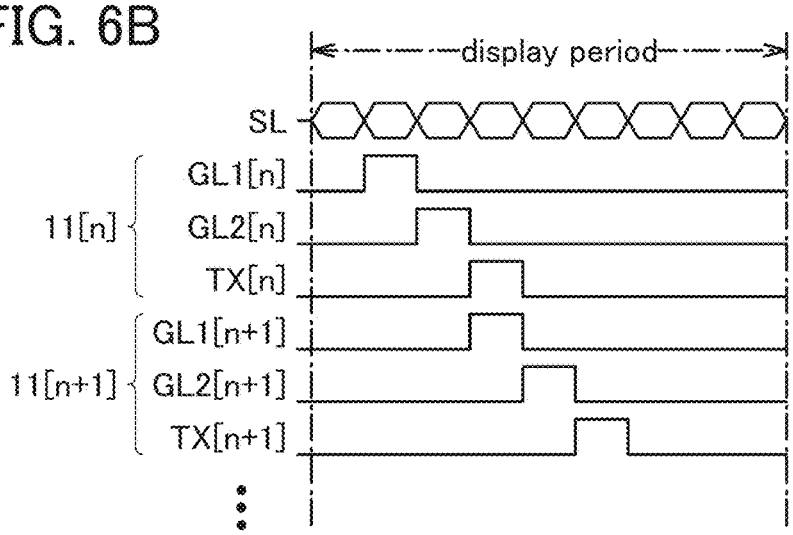

FIG. 6B is a timing chart showing an example of a driving method. Here, a pixel unit in the n-th position in the scanning direction is referred to as a pixel unit 11[n], and a pixel unit in the (n+1)-th position following that is referred to as a pixel unit 11[n+1]. Note that wirings connected to the pixel unit 11[n] are given [n]; similarly, wirings connected to the pixel unit 11[n+1] are given [n+1].

As shown in FIG. 6B, wirings GL1[n] and GL2[n] are sequentially supplied with a high-level potential, so that the pixel circuits connected to the wirings GL1[n] and GL2[n] are supplied with a signal from the wiring SL. Next, a wiring TX[n] is supplied with a high-level potential, so that the gray level in each pixel circuit is corrected. By the repetition of such an operation, an image obtained by correcting a gray level according to the illuminance of external light can be displayed without time lag.

Here, the wiring TX[n] connected to the n-th pixel unit 11[n] and the wiring GL1[n+1] connected to the (n+1)-th pixel unit 11[n+1] may be supplied with the same signal. In that case, a circuit for supplying a signal to the wiring TX is not additionally provided, and thus the configuration can be simplified.

In the example of FIG. 6A, two gate lines (the wirings GL1 and GL2) are connected to one pixel unit 11; however, the number of gate lines connected thereto is not limited to two, and may be one or three or more.

Furthermore, in the example of FIG. 6A, two capacitors, the capacitor 43 and the capacitor 44, are provided; however, a configuration in which the capacitor 43 and the wiring VCs connected to the capacitor 43 are not provided can also be employed. With such a configuration, the amount of change in the gray level of the liquid crystal element 41 with respect to the amount of change in the potential of the node n can be larger, and the gray level of the liquid crystal element 41 can be changed over a wider range.

A normally-black element (performing black display without application of voltage) is used as the liquid crystal element 41, and the wiring VC is supplied with a potential lower than a potential input from the wiring SL. In that case, the gray level of the liquid crystal element 41 shifts to the high gray level side when the potential of the node n1 becomes high, and shifts to the low gray level side when the potential of the node n1 becomes low.

In contrast, the gray level of the liquid crystal element 41 shifts to the low gray level side when the potential of the node n1 becomes low, and shift to the high gray level side when the potential of the node n1 becomes high in the case where the wiring VC is supplied with a potential higher than a potential input from the wiring SL or in the case where a normally-white element (performing white display without application of voltage) is used as the liquid crystal element 41, for example. Therefore, the configuration of the light-receiving circuit 20 may be changed such that the potential of the node n becomes lower when the amount of light to which the light-receiving element 21 is exposed is larger. For example, the configuration of the light-receiving circuit 20 may be changed in the following manner: the anode and the cathode of the light-receiving element 21 are inverted, and the magnitude relation between the potentials supplied to the wiring VPR and the wiring VPO are inverted.

[Modification Example of Display Device]

A structure example of a display device having a function as a touch panel that senses the proximity or contact of an object will be described below.

Figure 7A:
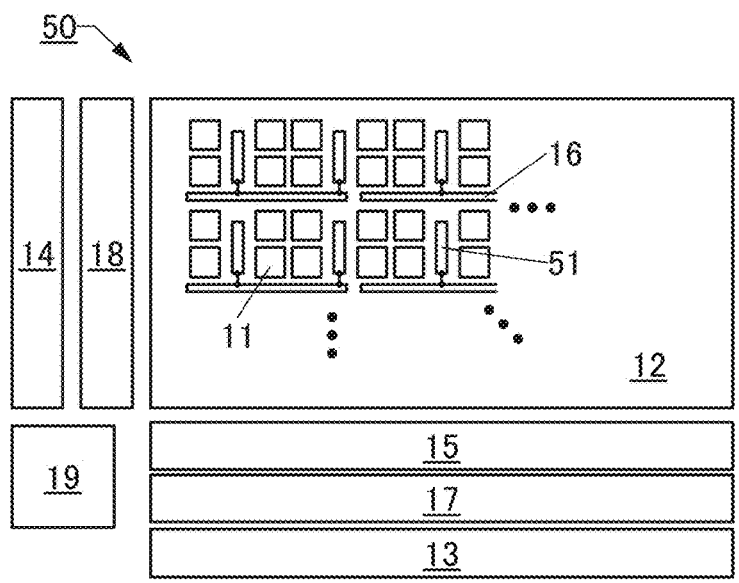
FIGS. 7A and 7B illustrate a display device of one embodiment.

A display device 50 illustrated in FIG. 7A includes, in addition to the display device 10 illustrated in FIG. 1A, a plurality of circuits 16 and a plurality of light-receiving elements 51 in the display region 12. The display device 50 includes a circuit 17, a circuit 18, and a circuit 19.

Figure 7B:
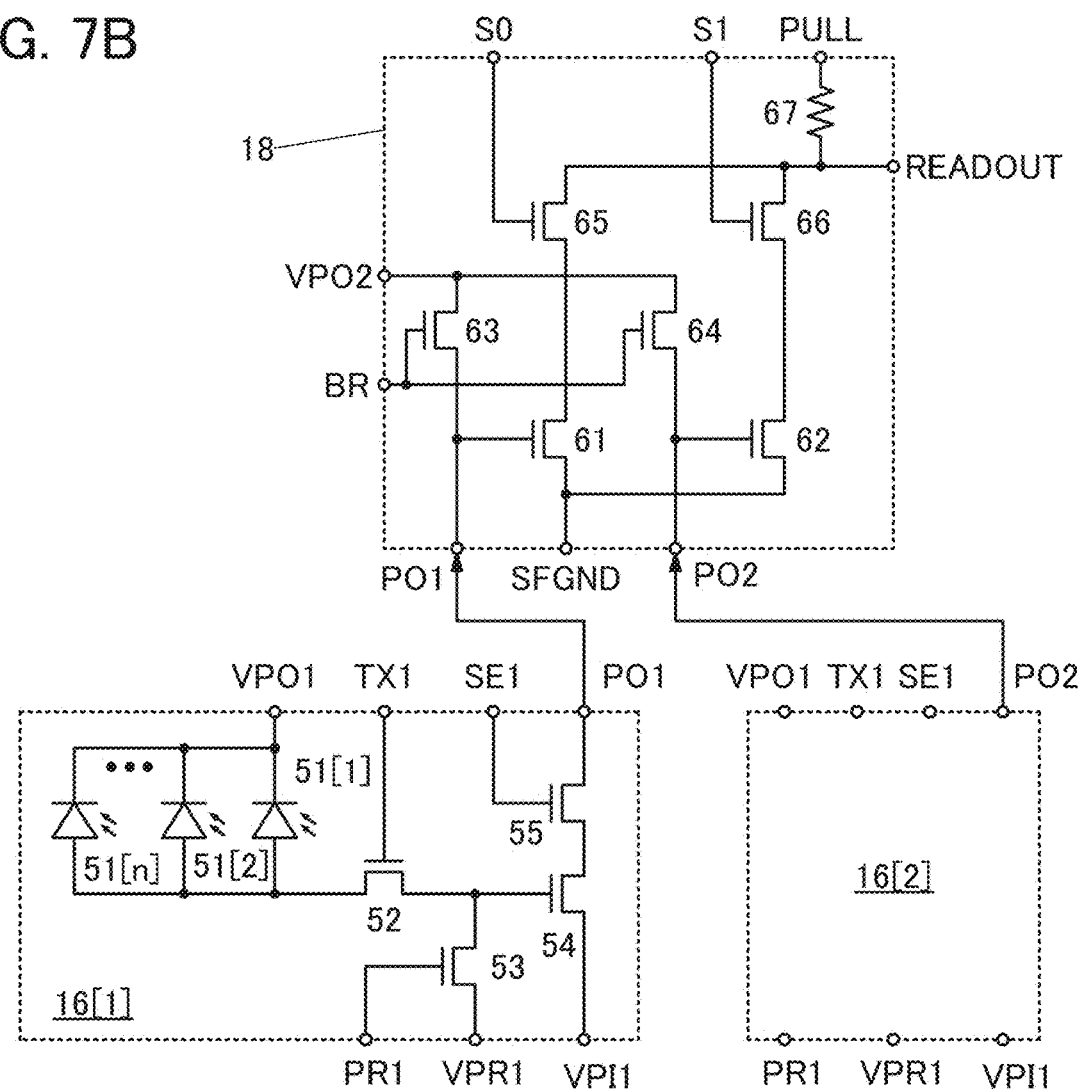

Each of the circuits 16 includes one or more light-receiving elements 51. The circuit 16 has a function of outputting, to the circuit 18, a signal corresponding to the amount of light to which the light-receiving element 51 is exposed. The circuit 17 is a circuit for outputting a signal or a potential for driving each of the plurality of circuits 16. The circuit 18 has a function of outputting, to the circuit 19, data of a difference between signals input from two of the plurality of circuits 16 as an output signal. The circuit 19 has a function of outputting positional data to the outside on the basis of a signal input from the circuit 18. Note that the circuits 17, 18, and 19 are separately described here; however, an IC having functions of these may be used instead. Alternatively, one or more of these three circuits may be formed over the same substrate as the pixel units, and the rest thereof may be mounted as an IC on the substrate. FIG. 7B illustrates more specific examples of the circuit 16 and the circuit 18.

Here, for the sake of simplicity, an example in which two circuits 16 (a circuit 16[1] and a circuit 16[2]) are connected to the circuit 18 is described. An actual circuit includes a plurality of configurations illustrated in FIG. 7B.

First, the configuration of the circuit 16 will be described. Here, the circuit 16[1] and the circuit 16[2] are collectively referred to as the circuits 16 because they can have the same configuration.

The circuit 16 includes n (n is an integer of 1 or more) light-receiving elements 51 (light-receiving element 51[1] to 51[n]), a transistor 52, a transistor 53, a transistor 54, and a transistor 55. The n light-receiving elements are collectively referred to as the light-receiving elements 51 without distinction because they can have the same configuration. The n light-receiving elements 51 are connected in parallel.

In the circuit 16, in response to a signal supplied to a wiring PR1, the potential of a gate of the transistor 54 is reset to a potential supplied to a wiring VPR1. In response to a signal supplied to a wiring TX1, the potential of the gate of the transistor 54 is determined according to the amount of light to which the n light-receiving elements 51 are exposed. In response to a signal supplied to a wiring SE1, a potential corresponding to the potential of the gate of the transistor 54 is output to the circuit 18 through a wiring PO1 (or a wiring PO2).

The circuit 18 includes transistors 61 to 66 and a resistor 67.

In the circuit 18, in response to a signal supplied to a wiring BR, the potentials of gates of the transistors 61 and 62 are reset to a potential supplied to a wiring VPO2. In response to a signal supplied to a wiring S0 and a wiring S1 alternately, a signal corresponding to a potential input from the wiring PO1 and the wiring PO2 is output to a wiring READOUT. An output signal from the wiring READOUT is supplied to, for example, an analog-to-digital converter circuit or the like included in the circuit 19 and can be processed as a digital signal.

With such a configuration, for example, when the display screen of the display device 50 is touched with an object such as a finger, positional data of the object can be detected.

For example, when pixels in the circuit 16[1] perform black display and detection of positional data is performed, a position where the object blocks external light can be specified. Furthermore, when pixels in the circuit 16[2] perform display of a specific color and detection of positional data is performed, a position where the intensity of light reflected by the object is high, i.e., a position to which the object is the closest can be detected. These operations are performed alternately and a difference between positional data is obtained, whereby positional detection can be performed with high accuracy.

Note that in FIGS. 7A and 7B and the like, for the semiconductor films of the transistors in the circuits 16 and 18, oxide semiconductors or the following semiconductors other than oxide semiconductors may be used: amorphous silicon, microcrystalline silicon, polycrystalline silicon, single crystal silicon, amorphous germanium, microcrystalline germanium, polycrystalline germanium, single crystal germanium, and the like. By using the same semiconductor material for the semiconductor films of all the transistors in the circuits 16 and 18, a process can be simplified.

In particular, the off-state current of each of the transistors 52 and 53 is preferably small in order that charge accumulated in the node connected thereto can be held. A transistor in which a channel formation region is formed in a film of an oxide semiconductor having a wider band gap and lower intrinsic carrier density than silicon is preferably used as each of the transistors 52 and 53. When a semiconductor material that provides higher mobility than an oxide semiconductor, such as polycrystalline or single crystal silicon, is used for semiconductor films of the transistors 54 and 55 and the transistors 61 to 66 included in the circuit 18, a signal can be read from the circuit 16 at high speed.

Note that unless otherwise specified, off-state current in this specification and the like means current that flows in a cut-off region between a source and a drain of a transistor.

[Cross-sectional Structure of Semiconductor Display Device]

Figure 8:
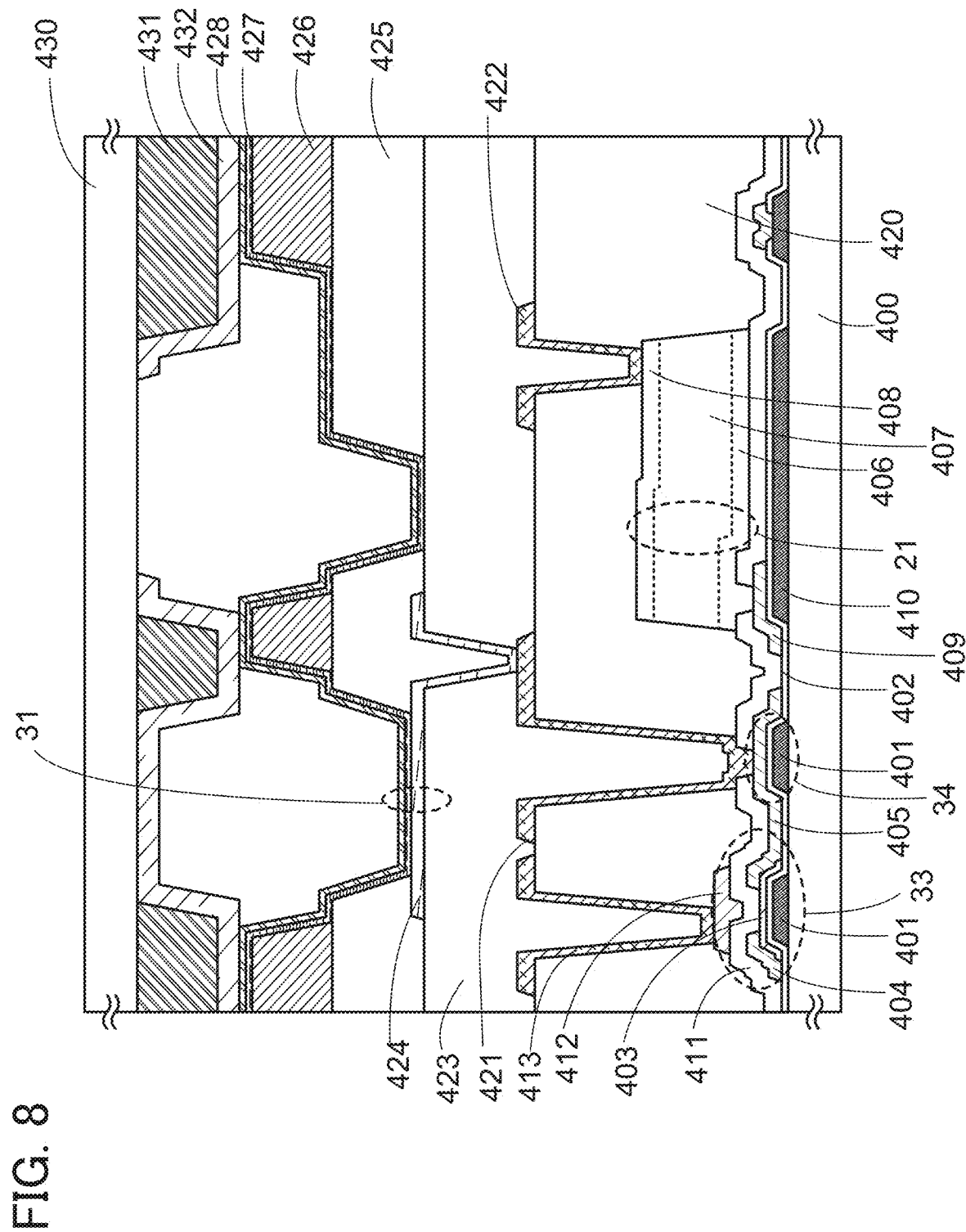
FIG. 8 illustrates a display device of one embodiment.

FIG. 8 illustrates an example of a cross-sectional structure of a display region in a display device of one embodiment of the present invention. In the example of FIG. 8, a cross-sectional structure of the light-receiving element 21, the display element 31, the transistor 33, and the capacitor 34 in FIG. 2A is shown.

The display device illustrated in FIG. 8 includes the transistor 33, the capacitor 34, and the light-receiving element 21 over a substrate 400. The transistor 33 includes a conductive layer 401 serving as a first gate; an insulating layer 402 over the conductive layer 401; a semiconductor layer 403 overlapping with the conductive layer 401 with the insulating layer 402 therebetween; a conductive layer 404 and a conductive layer 405 that are electrically connected to the semiconductor layer 403 and serve as a source and a drain; an insulating layer 411 over the semiconductor layer 403, the conductive layer 404, and the conductive layer 405; and a conductive layer 412 overlapping with the semiconductor layer 403 with the insulating layer 411 therebetween and serving as a second gate.

The capacitor 34 includes the conductive layer 401 that functions as an electrode; the insulating layer 402 over the conductive layer 401; and the conductive layer 405 that overlaps with the conductive layer 401 with the insulating layer 402 positioned therebetween and functions as an electrode.

The insulating layer 402 may be formed as a single layer or a stacked layer using one or more insulating films containing any of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In the case where an oxide semiconductor is used for the semiconductor layer 403, it is preferable that a material that can supply oxygen to the semiconductor layer 403 be used for the insulating layer 411. By using the material for the insulating layer 411, oxygen contained in the insulating layer 411 can be moved to the semiconductor layer 403, and the amount of oxygen vacancy in the semiconductor layer 403 can be reduced. Oxygen contained in the insulating layer 411 can be moved to the semiconductor layer 403 efficiently by heat treatment performed after the insulating layer 411 is formed.

The light-receiving element 21 includes a p-type semiconductor layer 406, an i-type semiconductor layer 407, and an n-type semiconductor layer 408 that are sequentially stacked. A conductive layer 409 is connected to the p-type semiconductor layer 406 that functions as the anode of the light-receiving element 21. A conductive layer 410 that has a function of reflecting light passing through the light-receiving element 21 is provided between the substrate 400 and the light-receiving element 21.

Note that a diode element formed using a single crystal substrate with a pn junction or a pin junction may also be used for the light-receiving element 21. Alternatively, a pin diode element formed using an amorphous silicon film, a microcrystalline silicon film, or the like may be used. Note that although an example in which a photodiode is included is described above, another photoelectric conversion element may alternatively be used. For example, a diode-connected transistor may be used. Alternatively, a variable resistor or the like utilizing a photoelectric effect may be formed using silicon, germanium, selenium, or the like. Alternatively, a photodiode that includes selenium utilizing avalanche multiplication may be used. Such a photodiode can be a highly sensitive light-receiving element in which the amplification of electrons with respect to the amount of incident light is large.

Specifically, the insulating layer 402 is provided over the conductive layer 410; the conductive layer 409 is provided over the insulating layer 402; the insulating layer 411 is provided over the conductive layer 409; and the semiconductor layer 406 of the light-receiving element 21 is provided over the insulating layer 411. An opening is formed in the insulating layer 411, and the conductive layer 409 is connected to the semiconductor layer 406 through the opening.

An insulating layer 420 is provided over the transistor 33, the capacitor 34, and the light-receiving element 21, and conductive layers 421, 422, and 413 are provided over the insulating layer 420. The conductive layer 421 is connected to the conductive layer 405 through an opening formed in the insulating layers 411 and 420. The conductive layer 422 is connected to the semiconductor layer 408 of the light-receiving element 21 through an opening formed in the insulating layer 420. The conductive layer 413 is connected to the conductive layer 412 of the transistor 33 through an opening formed in the insulating layer 420.

An insulating layer 423 is provided over the insulating layer 420 and the conductive layers 421, 422, and 413, and a conductive layer 424 is provided over the insulating layer 423. The conductive layer 424 is connected to the conductive layer 421 through an opening formed in the insulating layer 423.

An insulating layer 425 is provided over the insulating layer 423 and the conductive layer 424. The insulating layer 425 has an opening that overlaps with the conductive layer 424 and an opening that overlaps with the light-receiving element 21. Over the insulating layer 425, an insulating layer 426 is provided in a position that is different from the positions of the openings of the insulating layer 425. An EL layer 427 and a conductive layer 428 are sequentially stacked over the insulating layers 425 and 426. A portion in which the conductive layers 424 and 428 overlap with each other with the EL layer 427 positioned therebetween functions as the display element 31. One of the conductive layers 424 and 428 functions as an anode, and the other of the conductive layers 424 and 428 functions as a cathode.

The display device includes a substrate 430 that faces the substrate 400 with the display element 31 positioned therebetween. A blocking layer 431 that has a function of blocking light is provided on the substrate 430, i.e., on a surface of the substrate 430 that is close to the display element 31. The blocking layer 431 has an opening that overlaps with the display element 31 and an opening that overlaps with the light-receiving element 21. In the opening that overlaps with the display element 31, a coloring layer 432 that transmits visible light in a specific wavelength range is provided on the substrate 430. Note that to increase the intensity of light that passes through the substrate 430 and enters the light-receiving element 21, the coloring layer 432 preferably does not overlap with the light-receiving element 21.

At least part of this embodiment can be implemented in combination with any of the embodiments described in this specification as appropriate.

(Embodiment 2)

In this embodiment, an example of a transistor that can be used as the transistors described in the above embodiment will be described with reference to drawings.

The display device 10 of one embodiment of the present invention can be fabricated by using a transistor with any of various modes, such as a bottom-gate transistor or a top-gate transistor. Therefore, a material for a semiconductor layer or the structure of a transistor can be easily changed depending on the existing production line.

[Bottom-gate Transistor]

FIG. 9A1 is a cross-sectional view of a transistor 810 that is a channel-protective transistor, which is a type of bottom-gate transistor. In FIG. 9A1, the transistor 810 is formed over a substrate 771. The transistor 810 includes an electrode 746 over the substrate 771 with an insulating layer 772 provided therebetween. The transistor 810 includes a semiconductor layer 742 over the electrode 746 with an insulating layer 726 provided therebetween. The electrode 746 can serve as a gate electrode. The insulating layer 726 can serve as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can serve as one of a source electrode and a drain electrode. The electrode 744b can serve as the other of the source electrode and the drain electrode. Part of the electrode 744a and part of the electrode 744b are formed over the insulating layer 741.

The insulating layer 741 can serve a channel protective layer. With the insulating layer 741 is provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

The insulating layer 772 can be formed using a material and a method similar to those of insulating layers 722 and 705. Note that the insulating layer 772 may be formed of a stack of insulating layers. For example, the semiconductor layer 742 can be formed using a material and a method similar to those of the semiconductor layer 708. Note that the semiconductor layer 742 may be formed of a stack of semiconductor layers. For example, the electrode 746 can be formed using a material and a method similar to those of the electrode 706. Note that the electrode 746 may be formed of a stack of conductive layers. The insulating layer 726 can be formed using a material and a method similar to those of the insulating layer 707. Note that the insulating layer 726 may be formed of a stack of insulating layers. For example, the electrodes 744a and 744b can be formed using a material and a method similar to those of the electrode 714 or 715. Note that the electrodes 744a and 744b may be formed of a stack of conductive layers. For example, the insulating layer 741 can be formed using a material and a method similar to those of the insulating layer 726. Note that the insulating layer 741 may be formed of a stack of insulating layers. For example, the insulating layer 728 can be formed using a material and a method similar to those of the insulating layer 710. Note that the insulating layer 728 may be formed of a stack of insulating layers. For example, the insulating layer 729 can be formed using a material and a method similar to those of the insulating layer 711. Note that the insulating layer 729 may be formed of a stack of insulating layers.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions ($n^+$ layers). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce the contact resistance between the semiconductor layer 742 and each of the electrodes 744a and 744b. Accordingly, the electric characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and the electrode 744a and between the semiconductor layer 742 and the electrode 744b. The layer that serves as an n-type semiconductor or a p-type semiconductor can serve as the source region or the drain region in the transistor.

The insulating layer 729 is preferably formed using a material that can prevent or reduce diffusion of impurities into the transistor from the outside. The insulating layer 729 is not necessarily formed.

When an oxide semiconductor is used for the semiconductor layer 742, heat treatment may be performed before and/or after the insulating layer 729 is formed. The heat treatment can fill oxygen vacancies in the semiconductor layer 742 by diffusing oxygen contained in the insulating layer 729 or other insulating layers into the semiconductor layer 742. Alternatively, the insulating layer 729 may be formed while the heat treatment is performed, so that oxygen vacancies in the semiconductor layer 742 can be filled.

Note that a CVD method can be generally classified into a plasma enhanced CVD (PECVD) method using plasma, a thermal CVD (TCVD) method using heat, and the like. A CVD method can be further classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IBAD) method, an atomic layer deposition (ALD) method, and the like.

By using the PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between targets; thus, plasma damage to a substrate can be reduced. Furthermore, step coverage can be improved because the incident angle of a sputtered particle to a substrate can be made smaller depending on the inclination of the target.

A transistor 811 illustrated in FIG. 9A2 is different from the transistor 810 in that an electrode 723 that can serve as a back gate electrode is provided over the insulating layer 729. The electrode 723 can be formed using a material and a method similar to those of the electrode 746.

In general, the back gate electrode is formed using a conductive layer and positioned so that a channel formation region of a semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each serve as a gate electrode. Thus, the insulating layers 726, 728, and 729 can each serve as a gate insulating layer. The electrode 723 may also be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrodes 746 and 723 may be referred to as a "first gate electrode", and the other may be referred to as a "second gate electrode".

By providing the electrodes 746 and 723 with the semiconductor layer 742 provided therebetween and setting the potentials of the electrodes 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area occupied by a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrodes 746 and 723 each have a function of blocking an electric field generated outside, electric charge of charged particles and the like generated on the insulating layer 772 side or above the electrode 723 do not influence the channel formation region in the semiconductor layer 742. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the electrodes 746 and 723 have the same potential or different potentials.

The BT stress test is one kind of acceleration test and can evaluate, in a short time, a change by long-term use (i.e., a change over time) in characteristics of a transistor. In particular, the amount of change in the threshold voltage of a transistor before and after the BT stress test is an important indicator when examining the reliability of the transistor. As the change in threshold voltage is smaller, the transistor has higher reliability.

By providing the electrodes 746 and 723 and setting the potentials of the electrodes 746 and 723 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 9B1 is a cross-sectional view of a channel-protective transistor 820 that is a type of bottom-gate transistor. The transistor 820 has substantially the same structure as the transistor 810 but is different from the transistor 810 in that the insulating layer 741 covers an end portion of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can serve as a channel protective layer.

A transistor 821 illustrated in FIG. 9B2 is different from the transistor 820 in that the electrode 723 that can serve as a back gate electrode is provided over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The length between the electrode 744a and the electrode 746 and the length between the electrode 744b and the electrode 746 in the transistors 820 and 821 are larger than those in the transistors 810 and 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

A transistor 825 illustrated in FIG. 9C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 9C2 is different from the transistor 825 in that the electrode 723 which can serve as a back gate electrode is provided over the insulating layer 729.

[Top-gate Transistor]

FIG. 10A1 is a cross-sectional view of a transistor 830 that is a type of top-gate transistor. The transistor 830 includes the semiconductor layer 742 over the insulating layer 772, the electrodes 744a and 744b that are over the semiconductor layer 742 and the insulating layer 772 and in contact with part of the semiconductor layer 742, the insulating layer 726 over the semiconductor layer 742 and the electrodes 744a and 744b, and the electrode 746 over the insulating layer 726.

Since the electrode 746 overlaps with neither the electrode 744a nor the electrode 744b in the transistor 830, the parasitic capacitance generated between the electrodes 746 and 744a and the parasitic capacitance generated between the electrodes 746 and 744b can be reduced. After the formation of the electrode 746, an impurity 755 is introduced into the semiconductor layer 742 using the electrode 746 as a mask, so that an impurity region can be formed in the semiconductor layer 742 in a self-aligned manner (see FIG. 10A3). According to one embodiment of the present invention, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 10A2 is different from the transistor 830 in that the electrode 723 and the insulating layer 727 are included. The transistor 831 includes the electrode 723 formed over the insulating layer 772 and the insulating layer 727 formed over the electrode 723. The electrode 723 can serve as a back gate electrode. Thus, the insulating layer 727 can serve as a gate insulating layer. The insulating layer 727 can be formed using a material and a method similar to those of the insulating layer 726.

Like the transistor 811, the transistor 831 has a high on-state current for its area. That is, the area of the transistor 831 can be small for a required on-state current. According to one embodiment of the present invention, the area occupied by a transistor can be reduced. Therefore, according to one embodiment of the present invention, a semiconductor device having a high degree of integration can be provided.

A transistor 840 illustrated in FIG. 10B1 is a type of top-gate transistor. The transistor 840 is different from the transistor 830 in that the semiconductor layer 742 is formed after the formation of the electrodes 744a and 744b. A transistor 841 illustrated in FIG. 10B2 is different from the transistor 840 in that the electrode 723 and the insulating layer 727 are included. In the transistors 840 and 841, part of the semiconductor layer 742 is formed over the electrode 744a and another part of the semiconductor layer 742 is formed over the electrode 744b.

Like the transistor 811, the transistor 841 has a high on-state current for its area. That is, the area of the transistor 841 can be small for a required on-state current. According to one embodiment of the present invention, the area occupied by a transistor can be reduced. Therefore, according to one embodiment of the present invention, a semiconductor device having a high degree of integration can be provided.

A transistor 842 illustrated in FIG. 11A1 is a type of top-gate transistor. The transistor 842 is different from the transistor 830 or 840 in that the electrodes 744a and 744b are formed after the formation of the insulating layer 729. The electrodes 744a and 744b are electrically connected to the semiconductor layer 742 through openings formed in the insulating layers 728 and 729.

Part of the insulating layer 726 that does not overlap with the electrode 746 is removed, and the impurity 755 is introduced into the semiconductor layer 742 using the electrode 746 and the insulating layer 726 that is left as a mask, so that an impurity region can be formed in the semiconductor layer 742 in a self-aligned manner (see FIG. 11A3). The transistor 842 includes a region where the insulating layer 726 extends beyond an end portion of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region adjacent to a portion of the semiconductor layer 742 which overlaps with the electrode 746.

A transistor 843 illustrated in FIG. 11A2 is different from the transistor 842 in that the electrode 723 is included. The transistor 843 includes the electrode 723 that is formed over the substrate 771 and overlaps with the semiconductor layer 742 with the insulating layer 772 provided therebetween. The electrode 723 can serve as a back gate electrode.

As in a transistor 844 illustrated in FIG. 11B1 and a transistor 845 illustrated in FIG. 11B2, the insulating layer 726 in a region that does not overlap with the electrode 746 may be completely removed. Alternatively, as in a transistor 846 illustrated in FIG. 11C1 and a transistor 847 illustrated in FIG. 11C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

At least part of this embodiment can be implemented in appropriate combination with any of the other embodiments described in this specification.

(Embodiment 3)

<Composition of CAC-OS>

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 18:
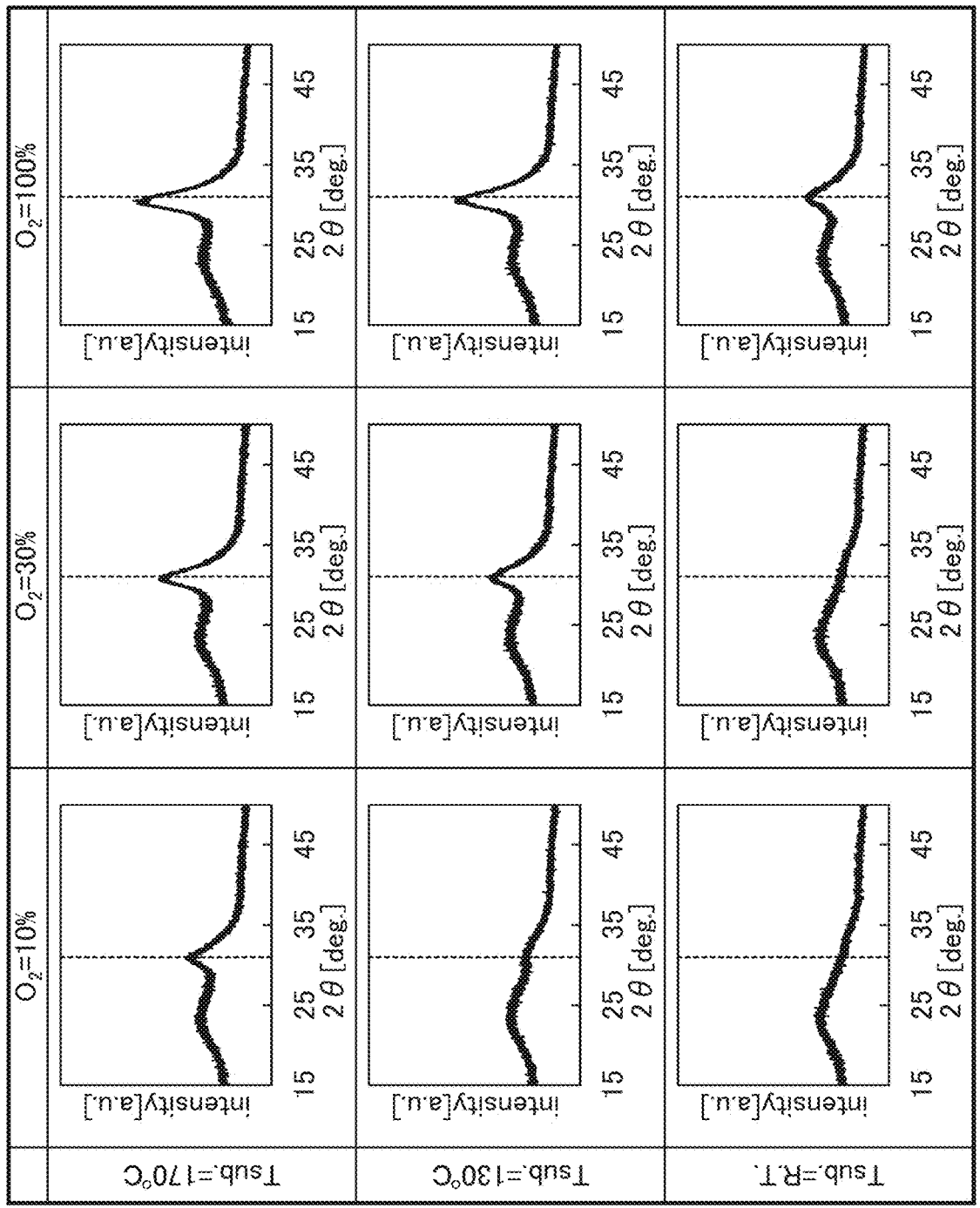
FIG. 18 shows measured XRD spectra of samples.

FIG. 18 shows XRD spectra measured by an out-of-plane method. In FIG. 18, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 18, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 18, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 19A is a plan-view TEM image of the sample formed at a substrate temperature of R.T. and with an oxygen gas flow rate ratio of 10%. FIG. 19B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 19A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 19C, 19D, 19E, 19F, and 19G show the results of the points indicated by the black dots a1, a2, a3, a4, and a5, respectively.

In FIGS. 19C, 19D, 19E, 19F, and 19G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 19B of the sample formed at a substrate temperature of R.T. and an oxygen gas flow rate ratio of 10% are observed. FIGS. 19H, 19I, 19J, 19K, and 19L show the results of the points indicated by the black dots b1, b2, b3, b4, and b5, respectively.

In FIGS. 19H, 19I, 19J, 19K, and 19L, regions with high luminance in a ring pattern can be shown. Furthermore, a plurality of spots can be shown in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 20A:
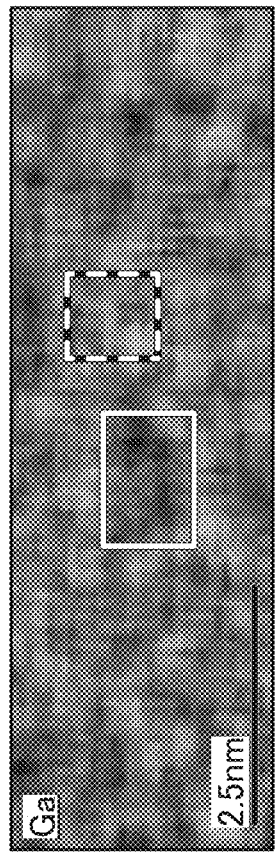
FIGS. 20A to 20C show EDX mapping images of a sample.
Figure 20B:
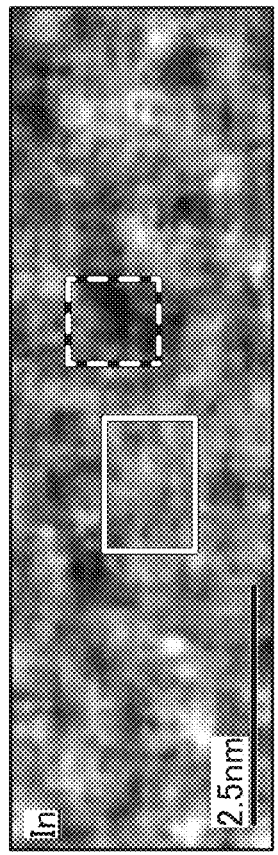
Figure 20C:
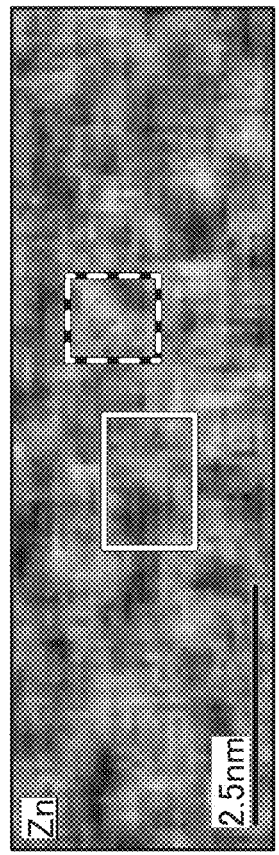

FIGS. 20A to 20C show EDX mapping images in a cross section of the sample formed at a substrate temperature of R.T. and with an oxygen gas flow rate ratio of 10%. FIG. 20A shows an EDX mapping image of Ga atoms. The proportion of the Ga atoms in all the atoms is 1.18 atomic % to 18.64 atomic %. FIG. 20B shows an EDX mapping image of In atoms. The proportion of the In atoms in all the atoms is 9.28 atomic % to 33.74 atomic %. FIG. 20C shows an EDX mapping image of Zn atoms. The proportion of the Zn atoms in all the atoms is 6.69 atomic % to 24.99 atomic %. FIGS. 20A to 20C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 20A to 20C is 7200000 times.

The EDX mapping images in FIGS. 20A to 20C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 20A to 20C are examined.

In FIG. 20A, a relatively dark region occupies a large area in the area surrounded by the solid line, while a relatively bright region occupies a large area in the area surrounded by the dashed line. In FIG. 20B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 20C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 20C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 20A to 20C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 20A to 20C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

(Embodiment 4)

In this embodiment, a display module and electronic devices that include the display device of one embodiment of the present invention will be described with reference to FIG. 12, FIGS. 13A to 13H, FIGS. 14A and 14B, FIGS. 15A to 15H, FIGS. 16A to 16I, and FIGS. 17A to 17E.

Figure 12:
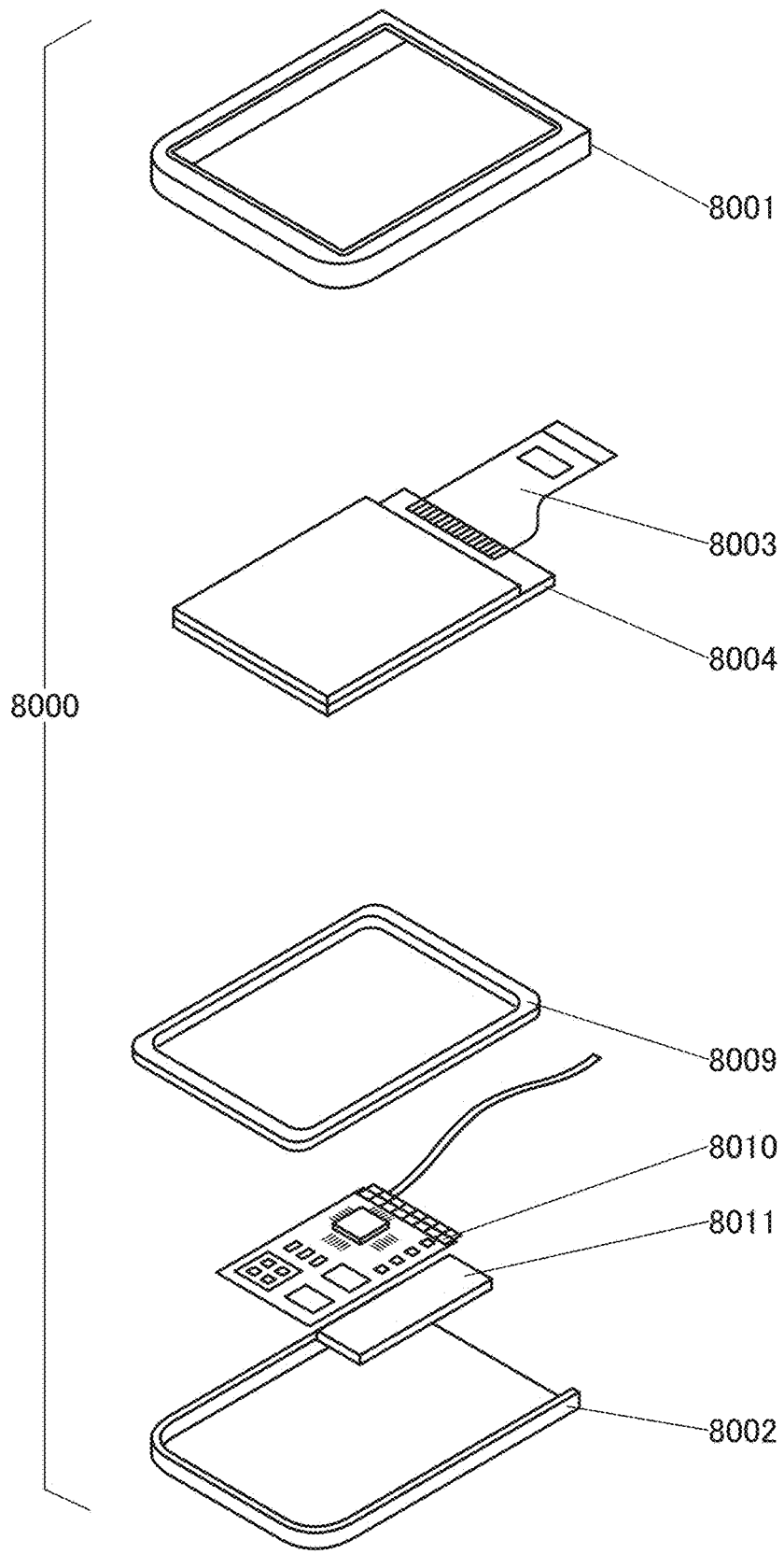
FIG. 12 illustrates a display module of one embodiment.

In a display module 8000 illustrated in FIG. 12, a touch panel 8004 connected to an FPC 8003, a frame 8009, a printed board 8010, and a battery 8011 are provided between an upper cover 8001 and a lower cover 8002.

The display panel, the touch panel, or the touch panel module of one embodiment of the present invention can be used for the touch panel 8004, for example.

The shapes and sizes of the upper cover 8001 and the lower cover 8002 can be changed as appropriate in accordance with the size of the touch panel 8004.

The touch panel 8004 can be a resistive touch panel or a capacitive touch panel and may be formed so as to overlap with a display panel. A counter substrate (sealing substrate)

of the touch panel 8004 can have a touch panel function. A photosensor may be provided in each pixel of the touch panel 8004 so that an optical touch panel can be obtained.

In the case where a transmissive or a semi-transmissive liquid crystal element is used, a backlight may be provided between the touch panel 8004 and the frame 8009. The backlight includes a light source. Note that the light source may be provided over the backlight; alternatively, the light source may be provided at an end portion of the backlight and a light diffusion plate may be further provided. Note that the backlight need not be provided in the case where a self-luminous light-emitting element such as an organic EL element is used or in the case where a reflective panel or the like is employed.

The frame 8009 protects the touch panel 8004 and also serves as an electromagnetic shield for blocking electromagnetic waves generated by the operation of the printed board 8010. The frame 8009 can also serve as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The touch panel 8004 can be additionally provided with a component such as a polarizing plate, a retardation plate, or a prism sheet.

Electronic devices and lighting devices can be manufactured by using the display panel, the light-emitting panel, the sensor panel, the touch panel, the touch panel module, the input device, the display device, or the input/output device of one embodiment of the present invention. Highly reliable electronic devices and lighting devices with curved surfaces can be manufactured by using the input device, the display device, or the input/output device of one embodiment of the present invention. In addition, flexible and highly reliable electronic devices and lighting devices can be manufactured by using the input device, the display device, or the input/output device of one embodiment of the present invention. Furthermore, electronic devices and lighting devices including touch sensors with improved sensitivity can be manufactured by using the input device or the input/output device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pachinko machine, and the like.

In the case of having flexibility, the electronic device or the lighting device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes a secondary battery, the antenna may be used for contactless power transmission.

FIGS. 13A to 13H and FIGS. 14A and 14B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 13A:
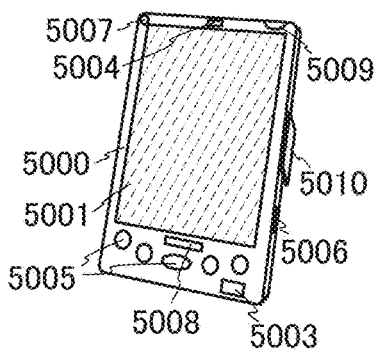
FIGS. 13A to 13H each illustrate an electronic device of one embodiment.

FIG. 13A illustrates a mobile computer, which can include a switch 5009, an infrared port 5010, and the like in addition to the above components.

Figure 13B:
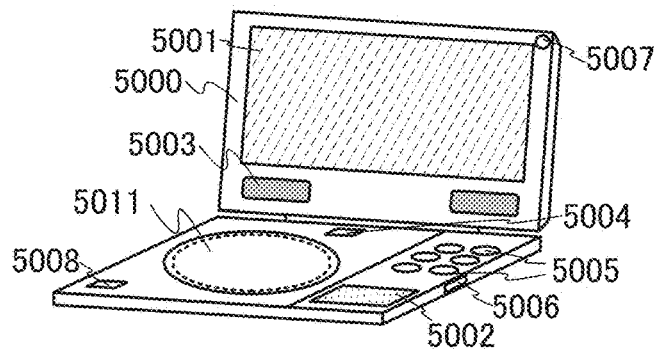

FIG. 13B illustrates a portable image reproducing device provided with a recording medium (e.g., a DVD reproducing device), which can include a second display portion 5002, a recording medium reading portion 5011, and the like in addition to the above components.

Figure 13C:
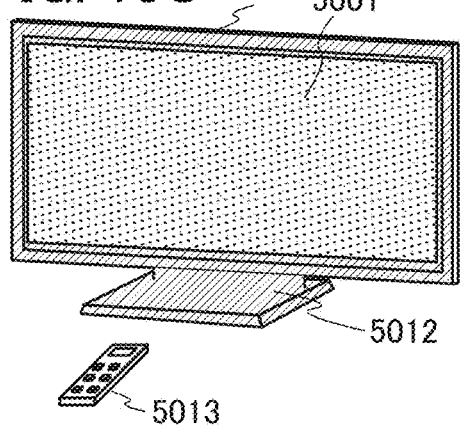

FIG. 13C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013.

Figure 13D:
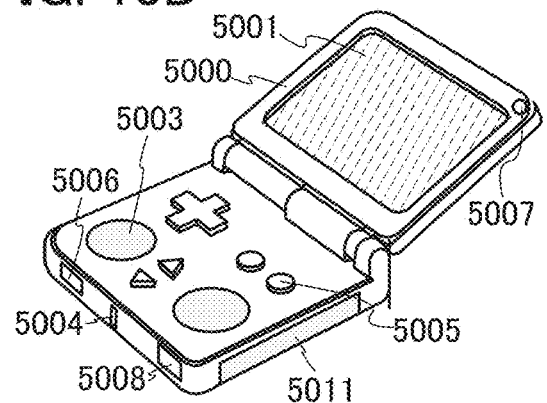

FIG. 13D illustrates a portable game machine, which can include the recording medium reading portion 5011 and the like in addition to the above components.

Figure 13E:
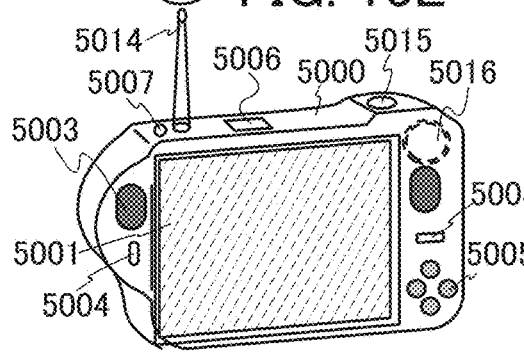

FIG. 13E illustrates a digital camera that has a television reception function and can include an antenna 5014, a shutter button 5015, an image receiving portion 5016, and the like in addition to the above components.

Figure 13F:
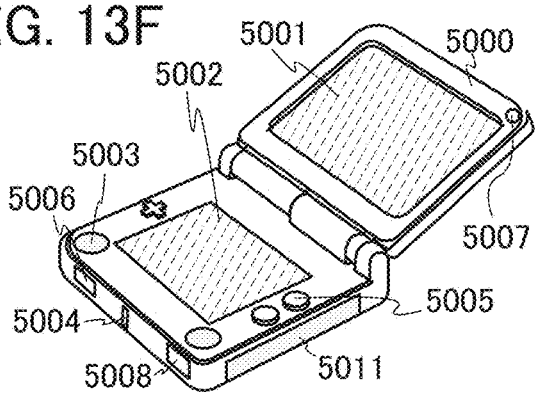

FIG. 13F illustrates a portable game machine, which can include the second display portion 5002, the recording medium reading portion 5011, and the like in addition to the above components.

Figure 13G:
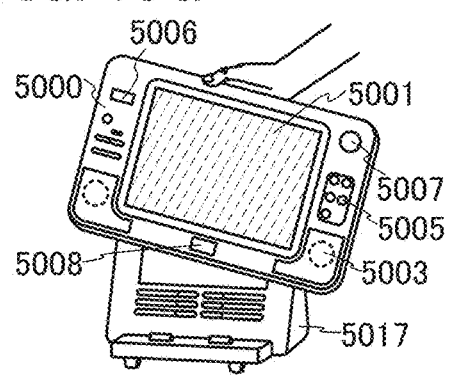

FIG. 13G illustrates a portable television receiver, which can include a charger 5017 capable of transmitting and receiving signals, and the like in addition to the above components.

Figure 13H:
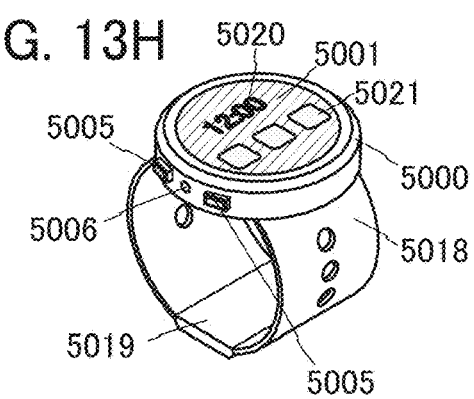

FIG. 13H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like.

Figure 14A:
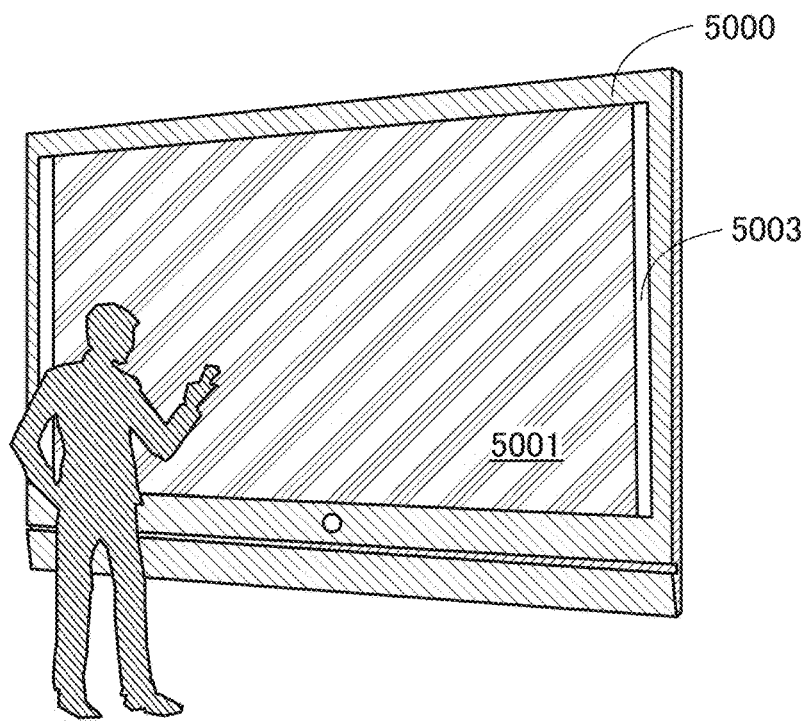
FIGS. 14A and 14B each illustrate an electronic device of one embodiment.
Figure 14B:
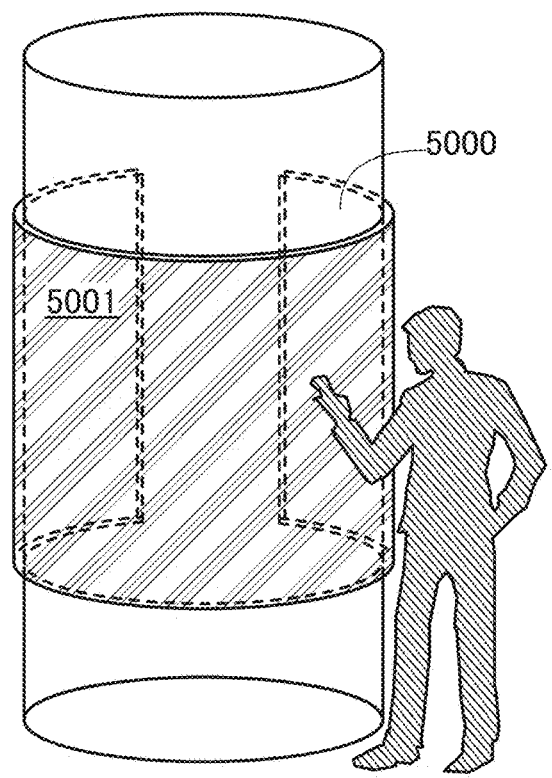

FIG. 14A illustrates a digital signage. FIG. 14B illustrates a digital signage mounted on a cylindrical pillar.

The electronic devices illustrated in FIGS. 13A to 13H and FIGS. 14A and 14B can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 13A to 13H and FIGS. 14A and 14B are not limited thereto, and the electronic devices can have a variety of functions.

FIGS. 15A, 15B, 15C1, 15C2, 15D, and 15E illustrate examples of an electronic device including a display portion 7000 with a curved surface. The display surface of the display portion 7000 is bent, and images can be displayed on the bent display surface. The display portion 7000 may be flexible.

The display portion 7000 can be formed using the functional panel, the display panel, the light-emitting panel, the sensor panel, the touch panel, the display device, the input/output device, or the like of one embodiment of the present invention. One embodiment of the present invention makes it possible to provide a highly reliable electronic device having a curved display portion.

FIG. 15A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 15A includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

FIG. 15B illustrates an example of a television set. In a television set 7200, the display portion 7000 is incorporated into a housing 7201. Here, the housing 7201 is supported by a stand 7203.

The television set 7200 illustrated in FIG. 15B can be operated with an operation switch of the housing 7201 or a separate remote controller 7211. The display portion 7000 may include a touch sensor, and can be operated by touch on the display portion with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 15C1, 15C2, 15D, and 15E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touch on the display portion 7000 with a finger, a stylus, or the like.

FIG. 15C1 is a perspective view of a portable information terminal 7300. FIG. 15C2 is a top view of the portable information terminal 7300. FIG. 15D is a perspective view of a portable information terminal 7310. FIG. 15E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminals 7300, 7310, and 7320 can display characters and image information on its plurality of surfaces. For example, as illustrated in FIGS. 15C1 and 15D, three operation buttons 7302 can be displayed on one surface, and information 7303 indicated by a rectangle can be displayed on another surface. FIGS. 15C1 and 15C2 illustrate an example in which information is displayed at the top of the portable information terminal. FIG. 15D illustrates an example in which information is displayed on the side of the portable information terminal. Information may be displayed on three or more surfaces of the portable information terminal. FIG. 15E shows an example in which information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) on the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 15F to 15H each illustrate an example of a lighting device having a curved light-emitting portion.

The light-emitting portion included in each of the lighting devices illustrated in FIGS. 15F to 15H can be manufactured using the functional panel, the display panel, the light-emitting panel, the sensor panel, the touch panel, the display device, the input/output device, or the like of one embodiment of the present invention. According to one embodiment of the present invention, a highly reliable lighting device having a curved light-emitting portion can be provided.

A lighting device 7400 illustrated in FIG. 15F includes a light-emitting portion 7402 with a wave-shaped light-emitting surface and thus is a good-design lighting device.

A light-emitting portion 7412 included in a lighting device 7410 illustrated in FIG. 15G has two convex-curved light-emitting portions symmetrically placed. Thus, all directions can be illuminated with the lighting device 7410 as a center.

A lighting device 7420 illustrated in FIG. 15H includes a concave-curved light-emitting portion 7422. This is suitable for illuminating a specific range because light emitted from the concave-curved light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 16A1, 16A2, and 16B to 16I each illustrate an example of a portable information terminal including a display portion 7001 having flexibility.

The display portion 7001 is manufactured using the functional panel, the display panel, the light-emitting panel, the sensor panel, the touch panel, the display device, the input/output device, or the like of one embodiment of the present invention. For example, a display device or an input/output device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIGS. 16A1 and 16A2 are a perspective view and a side view illustrating an example of the portable information terminal, respectively. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001.

The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 16A1, 16A2, and 16B shows an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 16B illustrates the portable information terminal 7500 in a state where the display portion 7001 is pulled out with the display portion tab 7502. Videos can be displayed on the display portion 7001 in this state. In addition, the portable information terminal 7500 may perform different displays in the state where part of the display portion 7001 is rolled as shown in FIG. 16A1 and in the state where the display portion 7001 is pulled out with the display portion tab 7502 as shown in FIG. 16B. For example, in the state shown in FIG. 16A1, the rolled portion of the display portion 7001 is put in a non-display state, reducing the power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 16C to 16E illustrate an example of a foldable portable information terminal. FIG. 16C illustrates a portable information terminal 7600 that is opened. FIG. 16D illustrates the portable information terminal 7600 that is being opened or being folded. FIG. 16E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 16F and 16G illustrate an example of a foldable portable information terminal. FIG. 16F illustrates a portable information terminal 7650 that is folded so that the display portion 7001 is on the inside. FIG. 16G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 16H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be included in the portable information terminal 7700. The flexible battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

FIG. 16I illustrates an example of a wrist-watch-type portable information terminal. The portable information terminal 7800 includes a band 7801, the display portion 7001, an input-output terminal 7802, operation buttons 7803, and the like. The band 7801 has a function of a housing. A flexible battery 7805 can be included in the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included in the portable information terminal 7800, data can be directly transmitted to and received from another information terminal via a connector. Charging through the input-output terminal 7802 is also possible. Note that charging of the portable information terminal described as an example in this embodiment can be performed by contactless power transmission without using the input-output terminal.

Figure 17A:
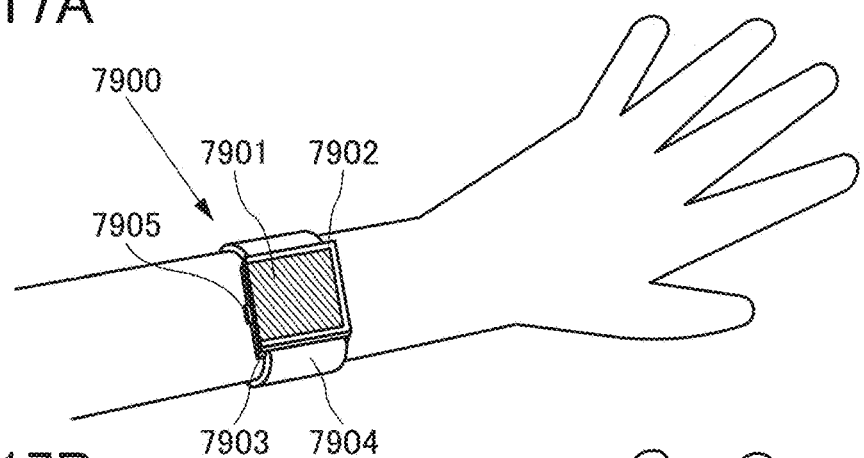
FIGS. 17A to 17E illustrate electronic devices of embodiments.
Figure 17B:
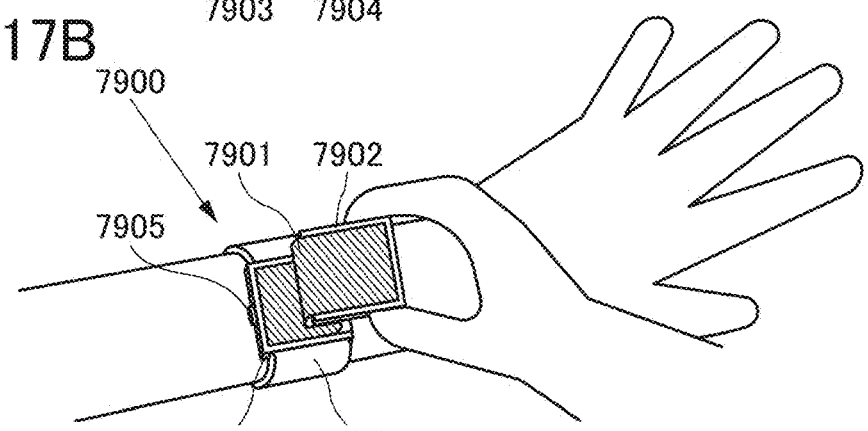
Figure 17C:
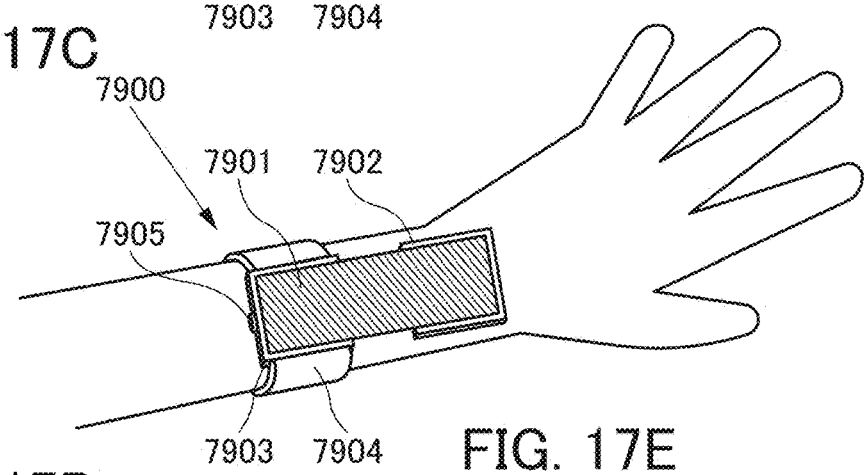

FIGS. 17A to 17C illustrate an example of a watch-type foldable portable information terminal. A portable information terminal 7900 includes a display portion 7901, a housing 7902, a housing 7903, a band 7904, an operation button 7905, and the like.

The portable information terminal 7900 can be reversibly changed in shape from a state in which the housing 7902 overlaps with the housing 7903 as illustrated in FIG. 17A into a state in which the display portion 7901 is opened as illustrated in FIG. 17C by lifting the housing 7902 as illustrated in FIG. 17B. Therefore, the portable information terminal 7900 can be generally used in a state where the display portion 7901 is folded and can be used in a wide display region by developing the display portion 7901.

When the display portion 7901 functions as a touch panel, the portable information terminal 7900 can be operated by touch on the display portion 7901. The portable information terminal 7900 can be operated by pushing, turning, or sliding the operation button 7905 vertically, forward, or backward.

A lock mechanism is preferably provided so that the housing 7902 and the housing 7903 are not detached from each other accidentally when overlapping with each other as illustrated in FIG. 17A. In that case, it is preferable that the lock state can be canceled by pushing the operation button 7905, for example. Alternatively, the lock state may be canceled by utilizing restoring force of a spring or the like as a mechanism in which the portable information terminal is automatically changed in form from the state illustrated in FIG. 17A into the state illustrated in FIG. 17C. Alternatively, the position of the housing 7902 relative to the housing 7903 may be fixed by utilizing magnetic force of magnets instead of the lock mechanism. By utilizing magnetic force, the housing 7902 and the housing 7903 can be easily attached or detached.

Figure 17D:
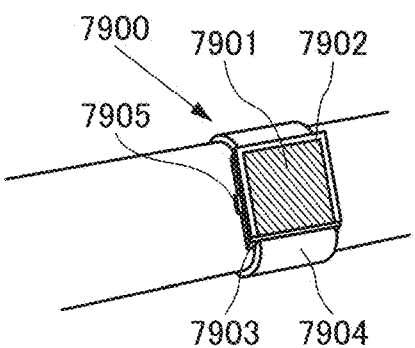
Figure 17E:
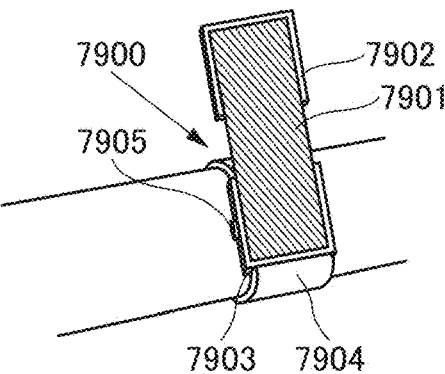

Although the display portion 7901 can be opened in a direction substantially perpendicular to the bending direction of the band 7904 in FIGS. 17A to 17C, the display portion 7901 may be opened in a direction substantially parallel to the bending direction of the band 7904 as illustrated in FIGS. 17D and 17E. In that case, the display portion 7901 may be used in a bent state to be wound to the band 7904.

The electronic devices in this embodiment each include a display portion for displaying some kind of information. The display device, the touch panel, the touch panel module, or the like of one embodiment of the present invention can be used for the display portion.

At least part of this embodiment can be implemented in appropriate combination with any of the other embodiments described in this specification.

This application is based on Japanese Patent Application serial no. 2015-150945 filed with Japan Patent Office on Jul. 30, 2015, and Japanese Patent Application serial no. 2016-119606 filed with Japan Patent Office on Jun. 16, 2016, the entire contents of which are hereby incorporated by reference.

What is claimed is:

1. A display device comprising:
   a first light-receiving circuit comprising a first light-receiving element, a first transistor, and a third transistor; and
   a pixel circuit comprising a light-emitting element and a second transistor,
   wherein the second transistor comprises a first gate and a second gate,
   wherein one of a source and a drain of the first transistor is electrically connected to an anode of the first light-receiving element through the third transistor,
   wherein one of a source and a drain of the second transistor is electrically connected to the light-emitting element,
   wherein the one of the source and the drain of the first transistor is electrically connected to one of the first gate and the second gate of the second transistor, wherein the other of the first gate and the second gate of the second transistor is electrically connected to a line to which a video signal is supplied, wherein a potential of the one of the source and the drain of the first transistor is supplied to the one of the first gate and the second gate of the second transistor, and wherein the video signal is supplied to the other of the first gate and the second gate of the second transistor.

2. The display device according to claim 1, wherein one of a source and a drain of the third transistor is electrically connected to the anode of the first light-receiving element, wherein the other of the source and the drain of the third transistor is electrically connected to the one of the source and the drain of the first transistor, wherein a first node is a node between the one of the source and the drain of the first transistor and the other of the source and the drain of the third transistor, wherein a potential of the first node is reset when the first transistor is on and the third transistor is off, wherein the potential of the first node is updated to a potential corresponding to an amount of light to which the first light-receiving element is exposed when the first transistor is off and the third transistor is on, and wherein the potential of the first node is held when the first transistor and the third transistor are off.

3. The display device according to claim 1, wherein the third transistor includes an oxide semiconductor in a semiconductor where a channel is formed.

4. The display device according to claim 1, wherein the first transistor includes an oxide semiconductor in a semiconductor where a channel is formed.

5. The display device according to claim 1, further comprising:
a second light-receiving circuit comprising a second light-receiving element; and
a circuit,
wherein the second light-receiving circuit is configured to output a signal based on an amount of light to which the second light-receiving element is exposed, and
wherein the circuit is configured to detect a touch operation on the basis of the signal.

6. An electronic device comprising the display device according to claim 1.

7. The display device according to claim 1, wherein different signals are supplied to the first gate and the second gate of the second transistor.

8. A display device comprising:
a first light-receiving circuit comprising a first light-receiving element, a first transistor, and a third transistor; and
a pixel circuit comprising a light-emitting element and a second transistor,
wherein the second transistor comprises a first gate and a second gate,
wherein one of a source and a drain of the first transistor is directly connected to one of a source and a drain of the third transistor,
wherein the other of the source and the drain of the third transistor is directly connected to an anode of the first light-receiving element,
wherein one of a source and a drain of the second transistor is electrically connected to the light-emitting element,
wherein the one of the source and the drain of the first transistor is electrically connected to one of the first gate and the second gate of the second transistor,
wherein the other of the first gate and the second gate of the second transistor is electrically connected to a line to which a video signal is supplied,
wherein a potential of the one of the source and the drain of the first transistor is supplied to the one of the first gate and the second gate of the second transistor, and
wherein the video signal is supplied to the other of the first gate and the second gate of the second transistor.

9. The display device according to claim 8, wherein the third transistor includes an oxide semiconductor in a semiconductor where a channel is formed.

10. The display device according to claim 8, wherein the first transistor includes an oxide semiconductor in a semiconductor where a channel is formed.

11. The display device according to claim 8, further comprising:
a second light-receiving circuit comprising a second light-receiving element; and
a circuit,
wherein the second light-receiving circuit is configured to output a signal based on an amount of light to which the second light-receiving element is exposed, and
wherein the circuit is configured to detect a touch operation on the basis of the signal.

12. The display device according to claim 8, wherein different signals are supplied to the first gate and the second gate of the second transistor.

13. An electronic device comprising the display device according to claim 8.

* * * * *